United States Patent
Park et al.

(10) Patent No.: US 12,082,508 B2
(45) Date of Patent: Sep. 3, 2024

(54) MEMORY DEVICE CONTAINING MAGNETIC TUNNEL JUNCTION

(71) Applicant: IUCF-HYU (INDUSTRY-UNIVERSITY COOPERATION FOUNDATION HANYANG UNIVERSITY), Seoul (KR)

(72) Inventors: Jea Gun Park, Seongnam-si (KR); Jong Ung Baek, Seongnam-si (KR)

(73) Assignee: IUCF-HYU (INDUSTRY-UNIVERSITY COOPERATION FOUNDATION HANYANG UNIVERSITY), Seoul (KR)

(*) Notice: Subject to any disclaimer, the term of this patent is extended or adjusted under 35 U.S.C. 154(b) by 533 days.

(21) Appl. No.: 17/296,042

(22) PCT Filed: Oct. 24, 2019

(86) PCT No.: PCT/KR2019/014086
§ 371 (c)(1),
(2) Date: May 21, 2021

(87) PCT Pub. No.: WO2020/105877
PCT Pub. Date: May 28, 2020

(65) Prior Publication Data
US 2022/0013714 A1    Jan. 13, 2022

(30) Foreign Application Priority Data
Nov. 22, 2018  (KR) .................. 10-2018-0145610

(51) Int. Cl.
*H01L 43/08*    (2006.01)
*H10B 61/00*    (2023.01)
(Continued)

(52) U.S. Cl.
CPC ............ *H10N 50/10* (2023.02); *H10B 61/20* (2023.02); *H10N 50/80* (2023.02); *H10N 50/85* (2023.02)

(58) Field of Classification Search
CPC ........ H10N 50/10; H10N 50/80; H10N 50/85; H10N 50/01; H10B 61/00–22;
(Continued)

(56) References Cited

U.S. PATENT DOCUMENTS

| | | | | |
|---|---|---|---|---|
| 2006/0056114 | A1* | 3/2006 | Fukumoto | B82Y 25/00 257/E27.005 |
| 2012/0280339 | A1* | 11/2012 | Zhang | H10N 50/80 257/E29.323 |
| 2018/0212142 | A1* | 7/2018 | Park | H10N 50/01 |
| 2019/0214432 | A1* | 7/2019 | Kim | H10N 50/01 |
| 2020/0005845 | A1* | 1/2020 | Gupta | H10N 50/01 |

FOREIGN PATENT DOCUMENTS

| | | |
|---|---|---|
| JP | 2006-261637 A | 9/2006 |
| JP | 2007-525847 A | 9/2007 |

(Continued)

OTHER PUBLICATIONS

Du-Yeong Lee et al., "Dependency of Tunneling-Magnetoresistance Ratio on Nanoscale Spacer Thickness and Material for Double MgO Based Perpendicular-Magnetic-Tunneling-Junction", Scientific Reports, Dec. 8, 2016, pp. 1-9.

(Continued)

*Primary Examiner* — Shahed Ahmed
(74) *Attorney, Agent, or Firm* — Sughrue Mion, PLLC

(57) ABSTRACT

Disclosed is a memory device including a lower electrode, a seed layer, a synthetic antiferromagnetic layer, a magnetic tunnel junction, and an upper electrode laminated on a substrate, wherein the magnetic tunnel junction includes a pinned layer, a tunnel barrier layer, and free layers, wherein the free layers include a first free layer, a spacer layer, a (Continued)

coupling layer, a buffer layer, and a second free layer laminated in sequential order.

15 Claims, 41 Drawing Sheets

(51) Int. Cl.
*H10N 50/10* (2023.01)
*H10N 50/80* (2023.01)
*H10N 50/85* (2023.01)

(58) Field of Classification Search
CPC ............. G11C 2211/5615; G11C 11/14–1697; G01R 33/098; G11B 5/3909
See application file for complete search history.

(56) References Cited

FOREIGN PATENT DOCUMENTS

| KR | 10-2007-0121504 A | 12/2007 |
| KR | 10-2016-0113504 A | 9/2016 |
| KR | 10-1737130 A | 5/2017 |

OTHER PUBLICATIONS

Shuai Liu et al., "Co/Pt multilayer-based pseudo spin valves with perpendicular magnetic anisotropy", Rare Materials, Nov. 7, 2014, pp. 646-651, vol. 33, No. 6.
Korean Office Action for 10-2018-0145610 dated, Dec. 30, 2020.
International Search Report for PCT/KR2019/014086 dated, Jan. 30, 2020 (PCT/ISA/210).

* cited by examiner

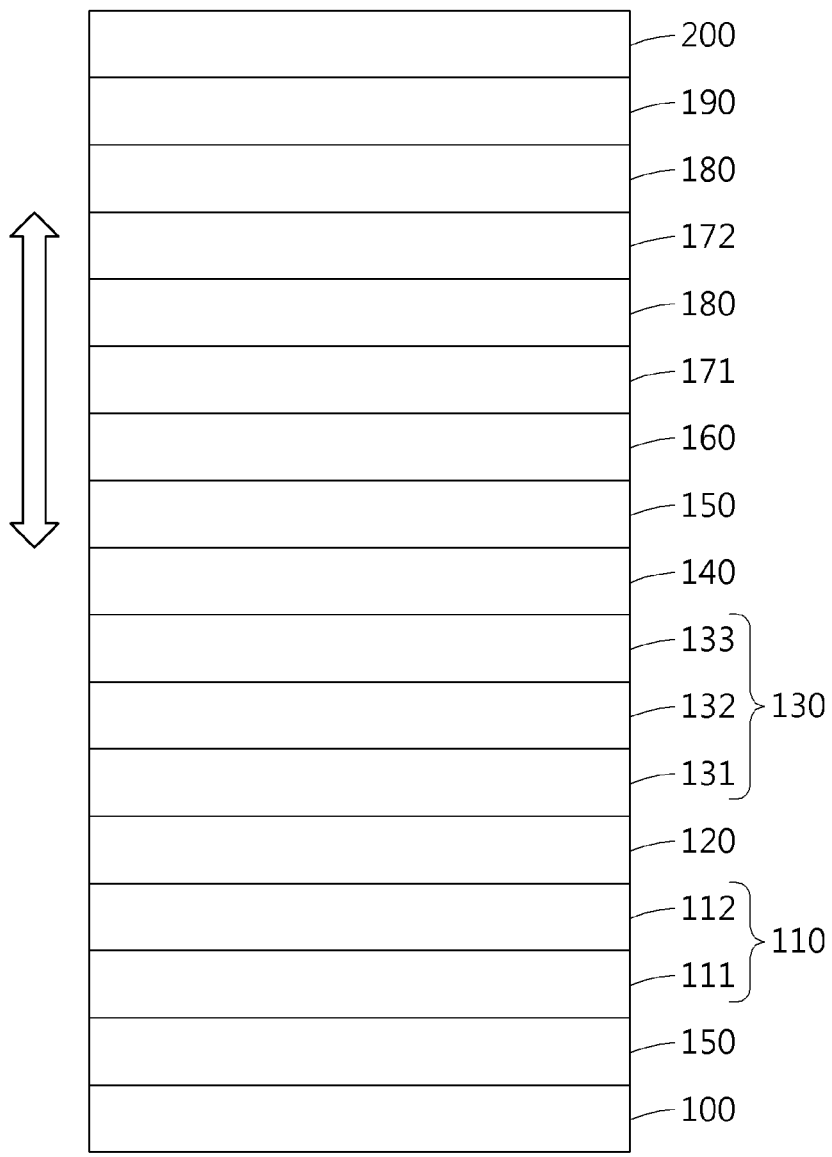
[FIG. 1]

[FIG. 2]
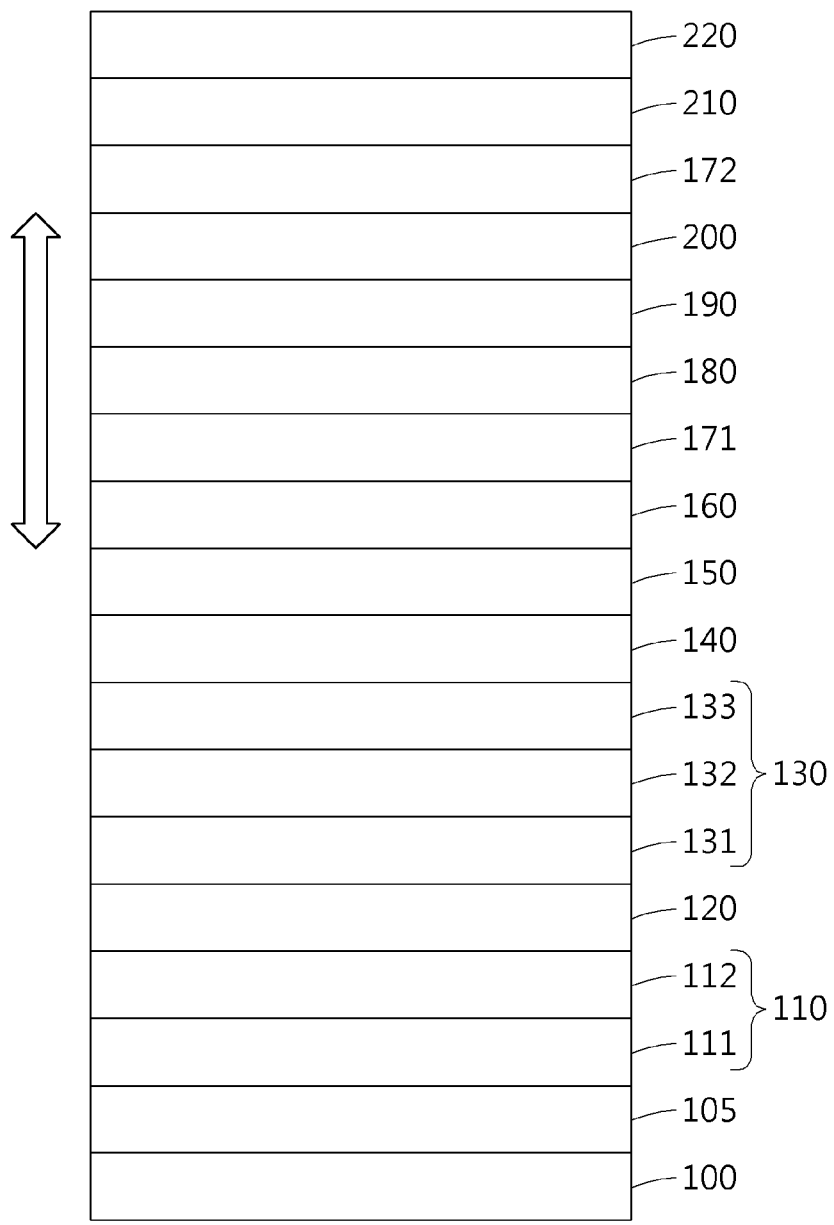

[FIG. 3A]
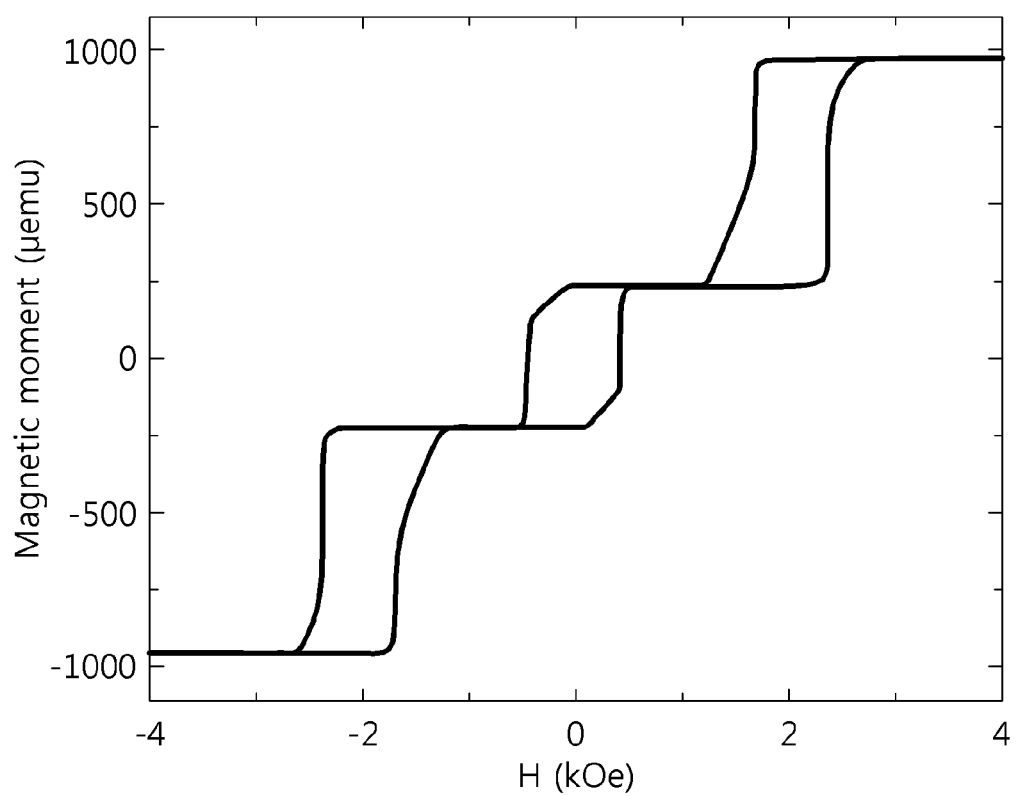

[FIG. 3B]
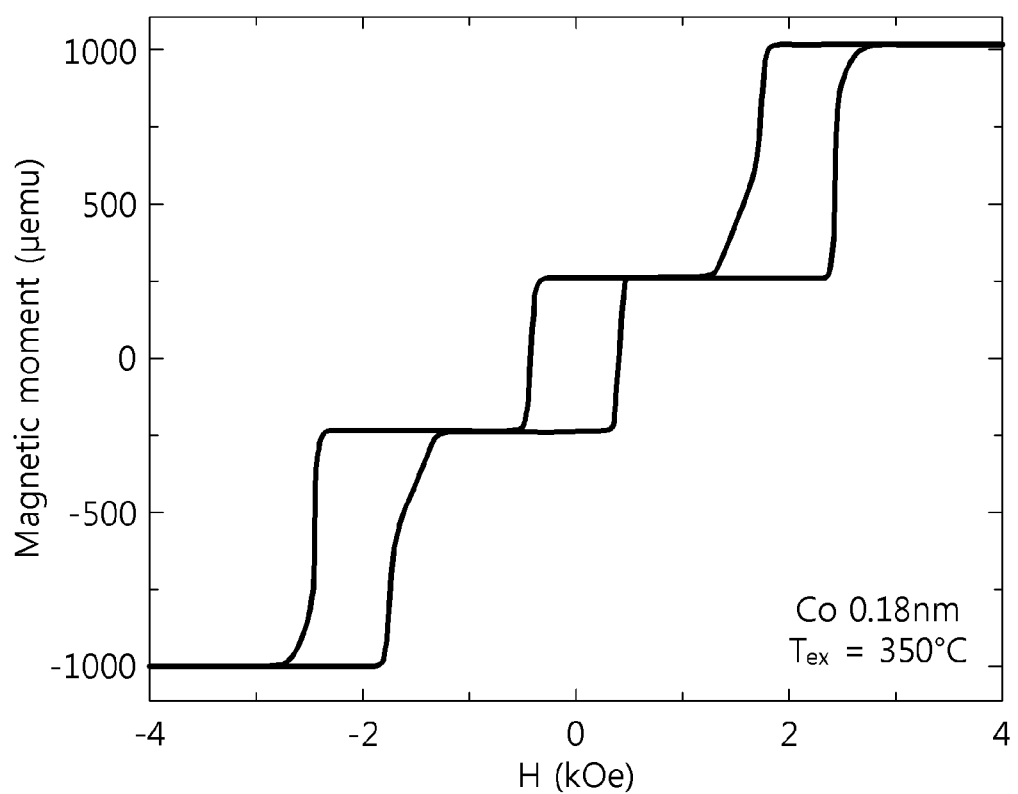

[FIG. 3C]
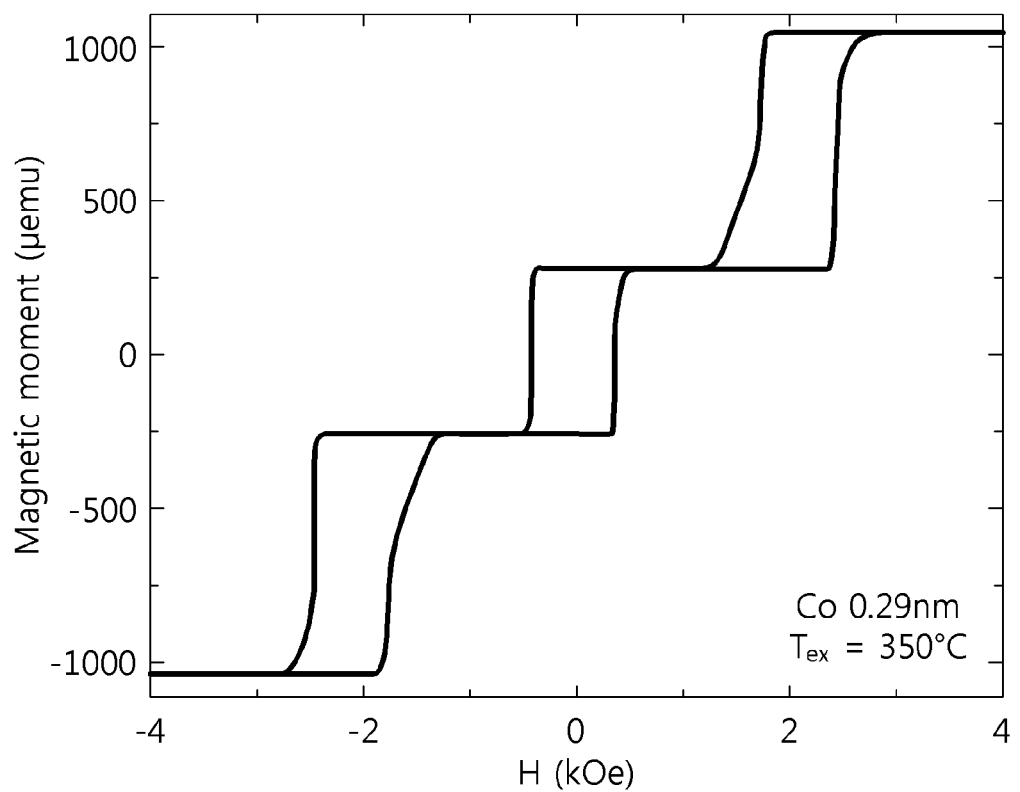

[FIG. 3D]
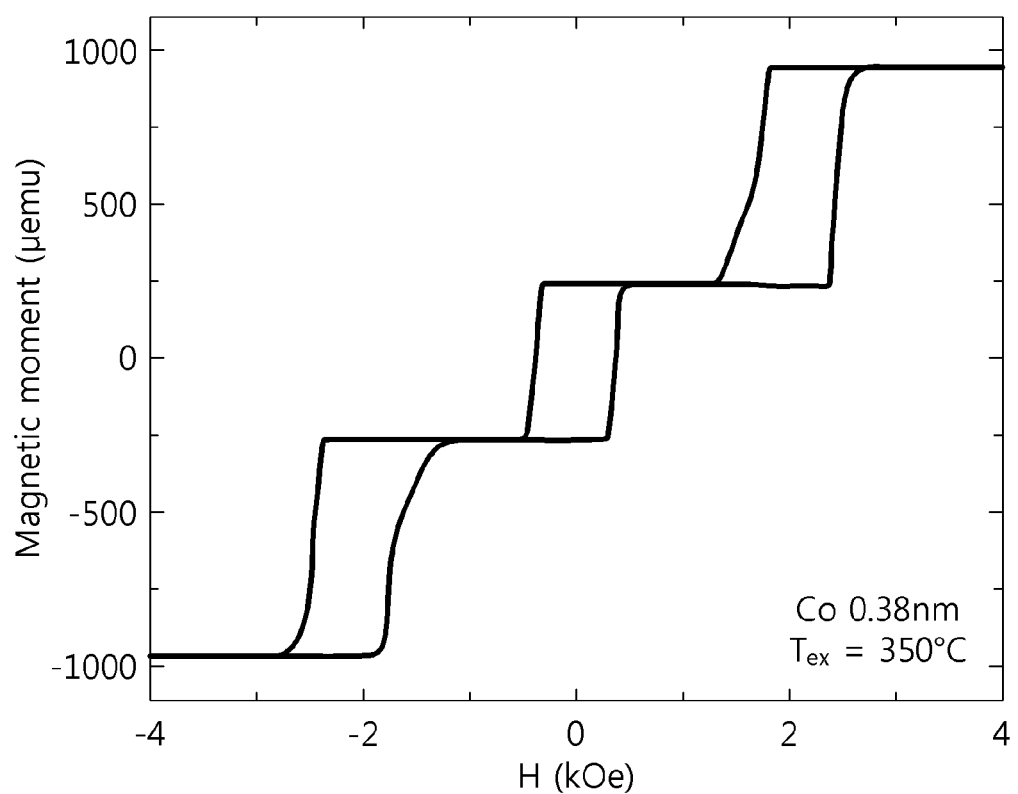

[FIG. 3E]
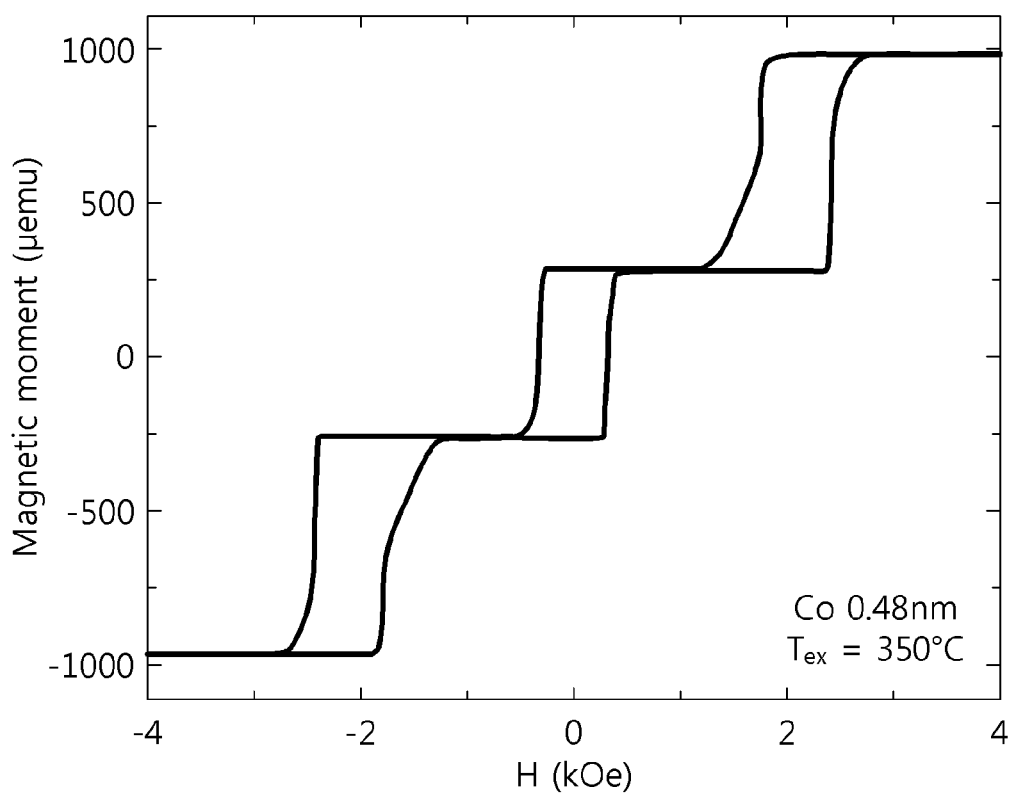

[FIG. 4A]
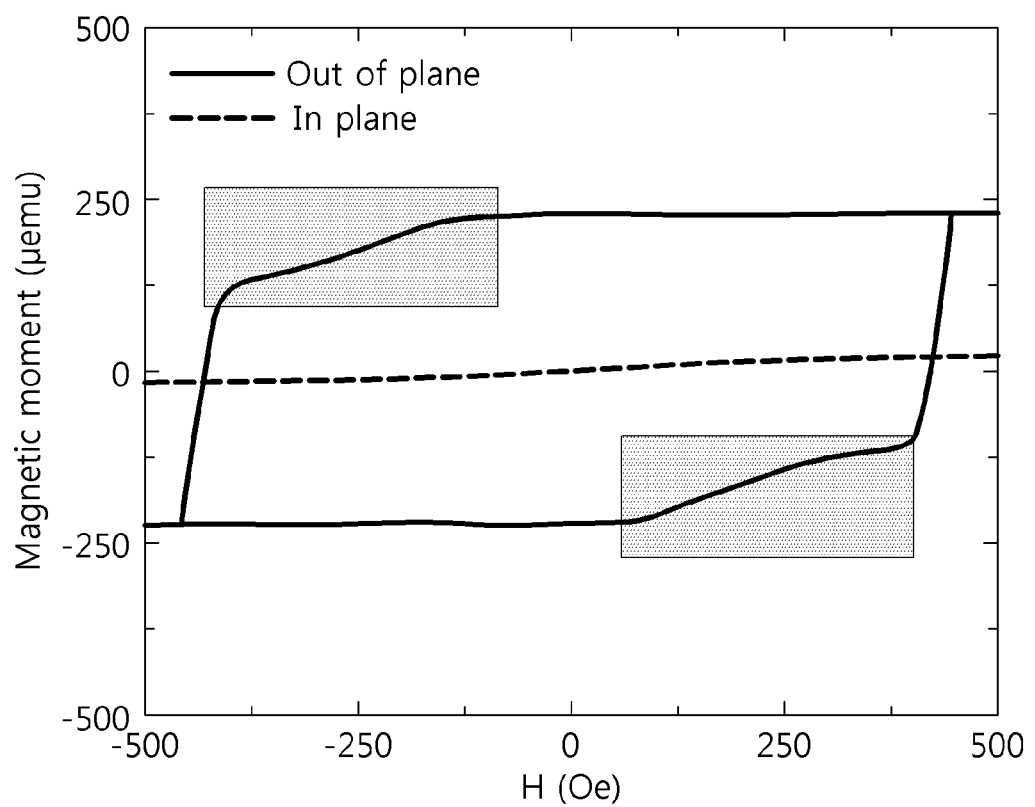

[FIG. 4B]
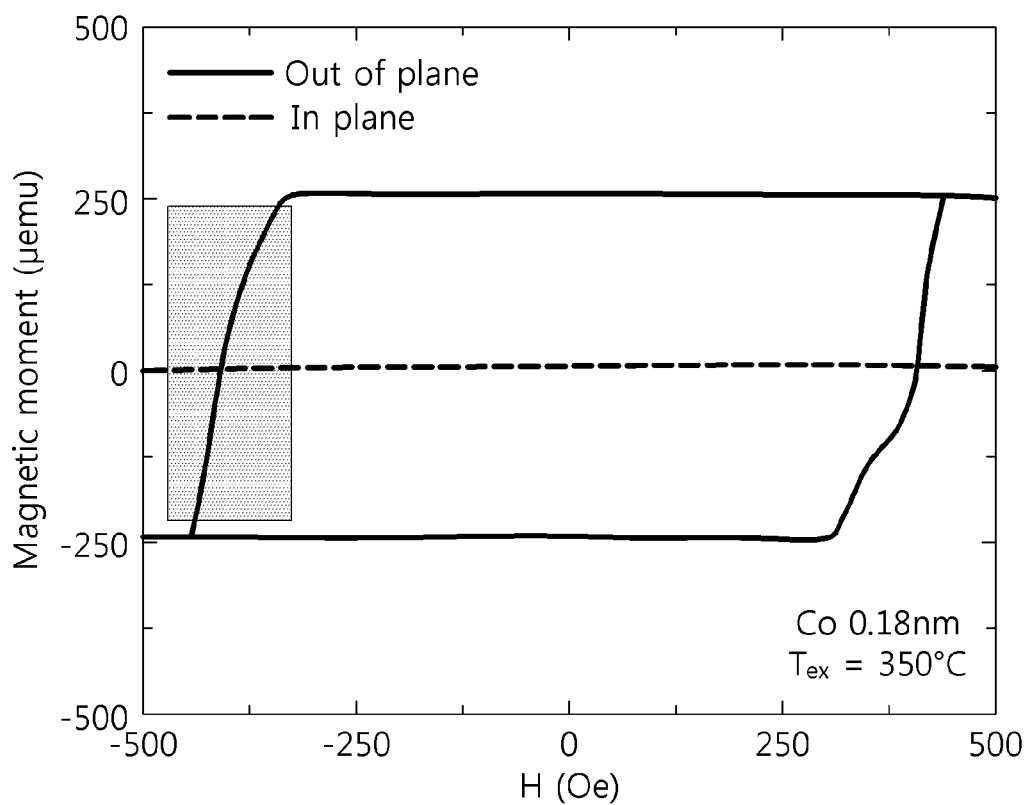

[FIG. 4C]
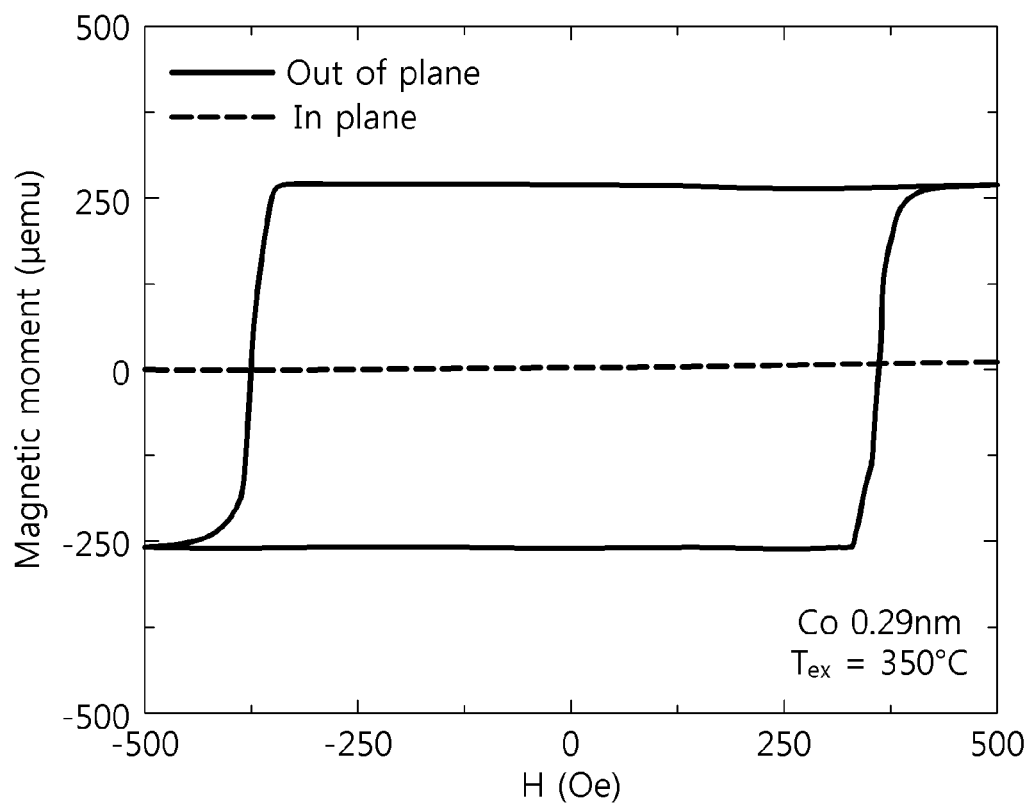

[FIG. 4D]
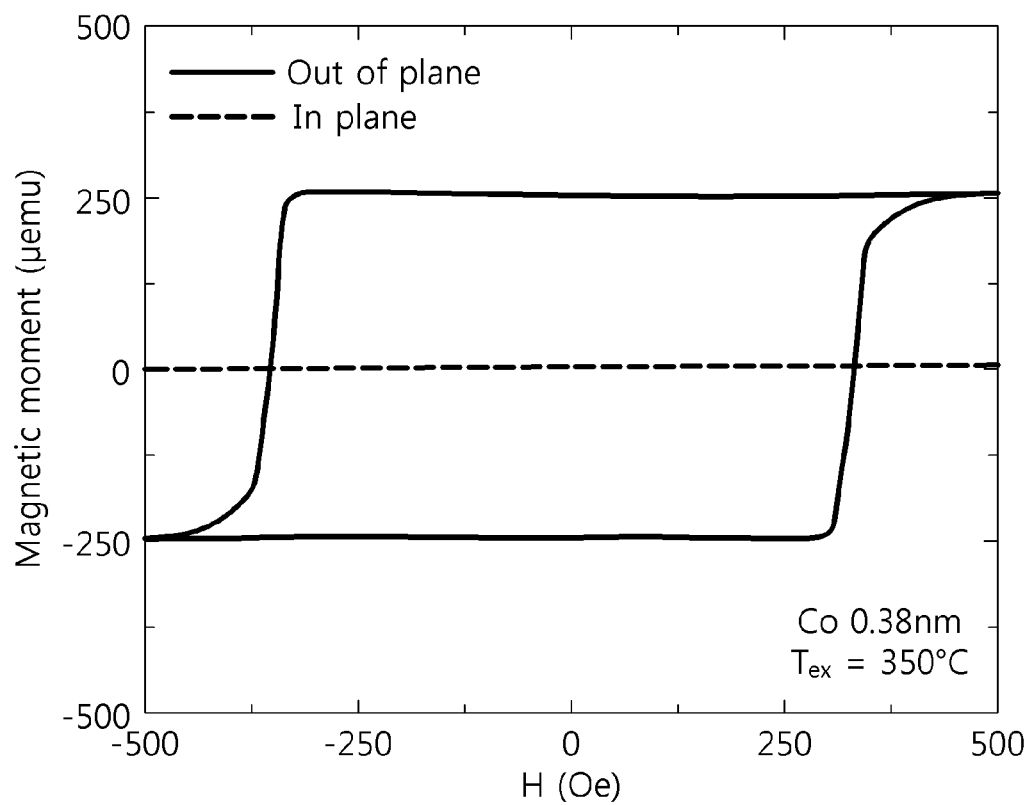

[FIG. 4E]
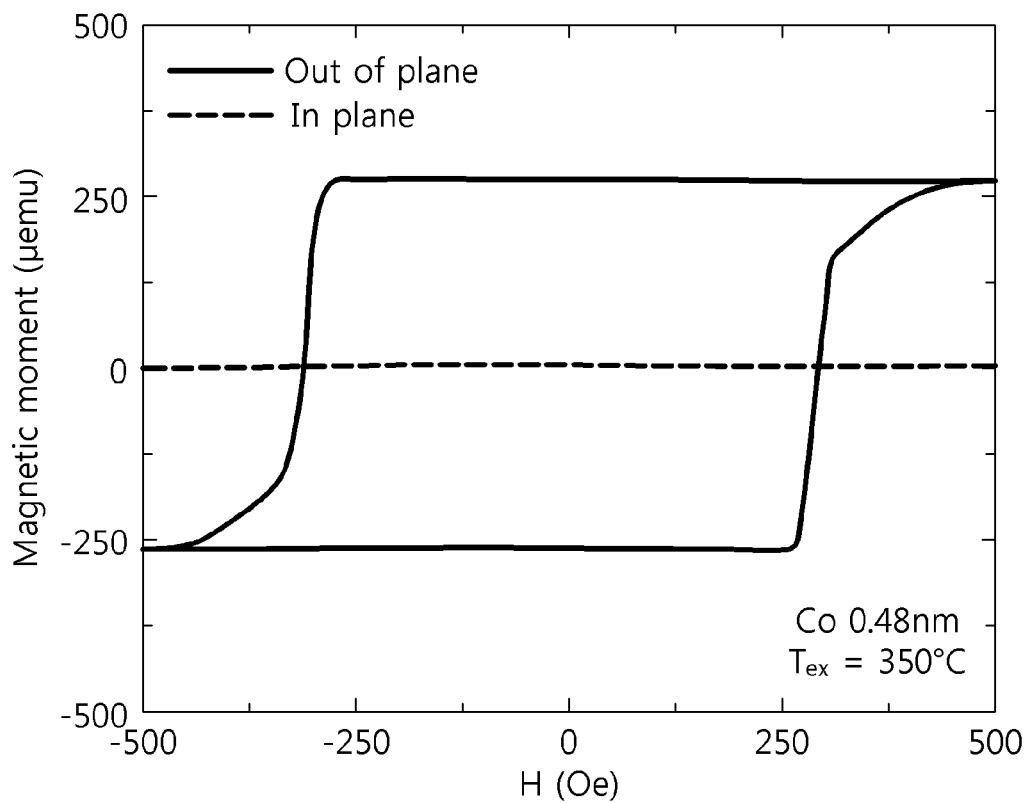

[FIG. 5A]
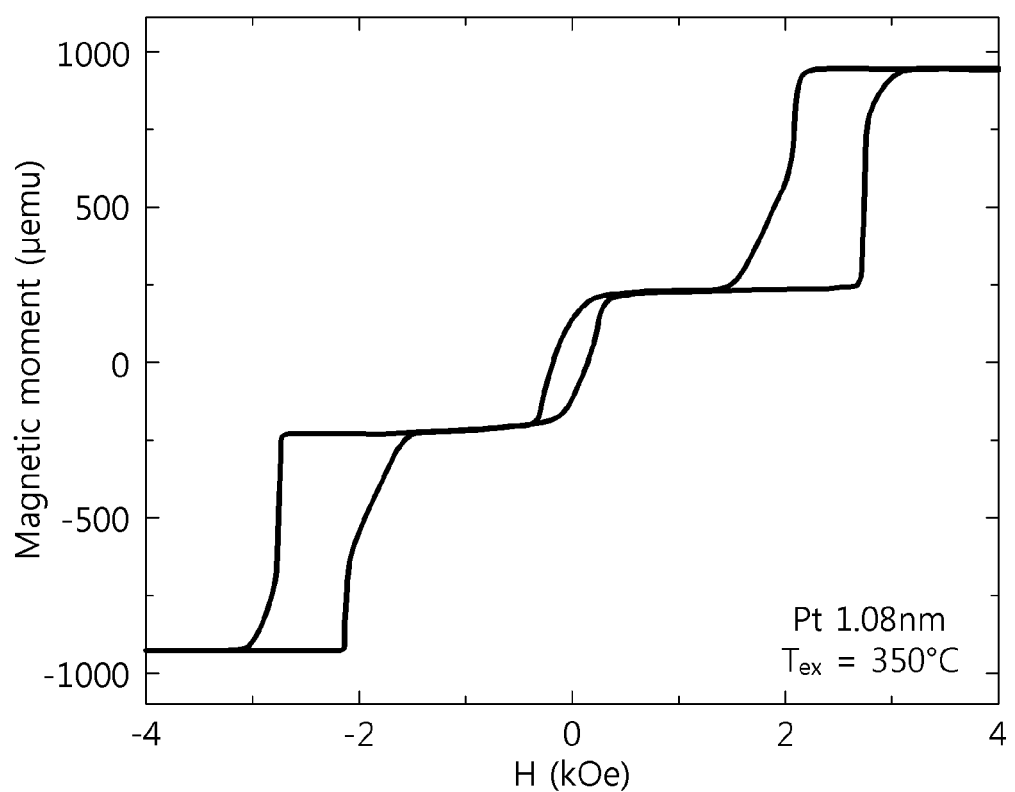

[FIG. 5B]
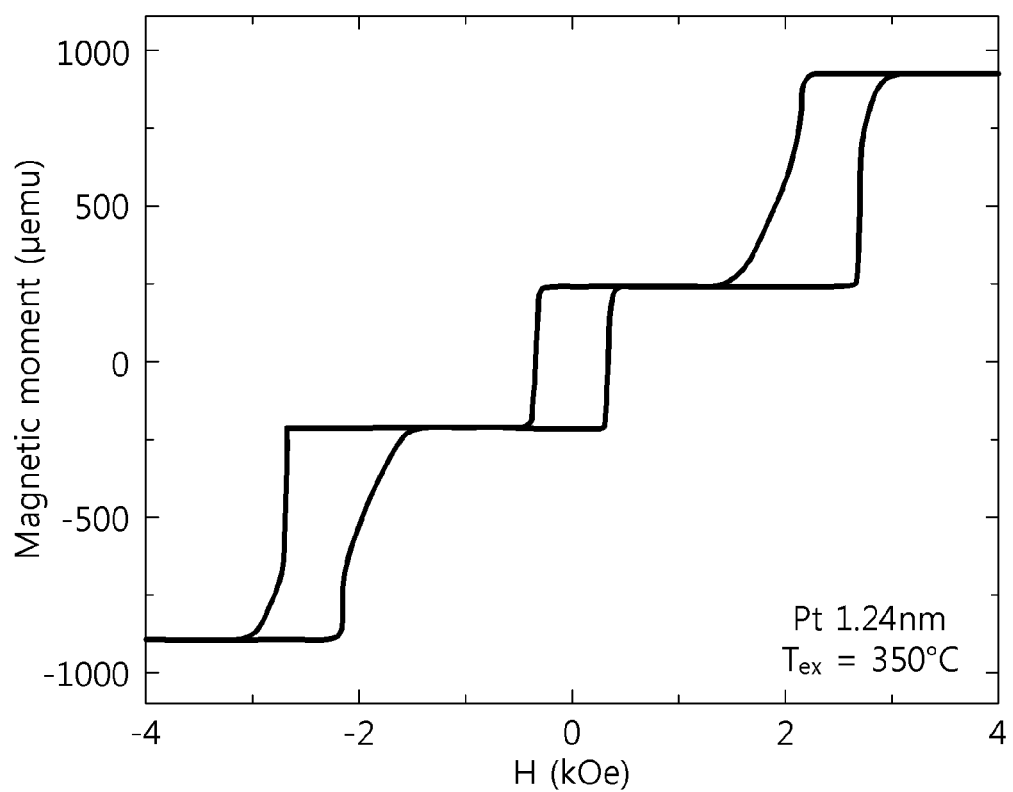

[FIG. 5C]
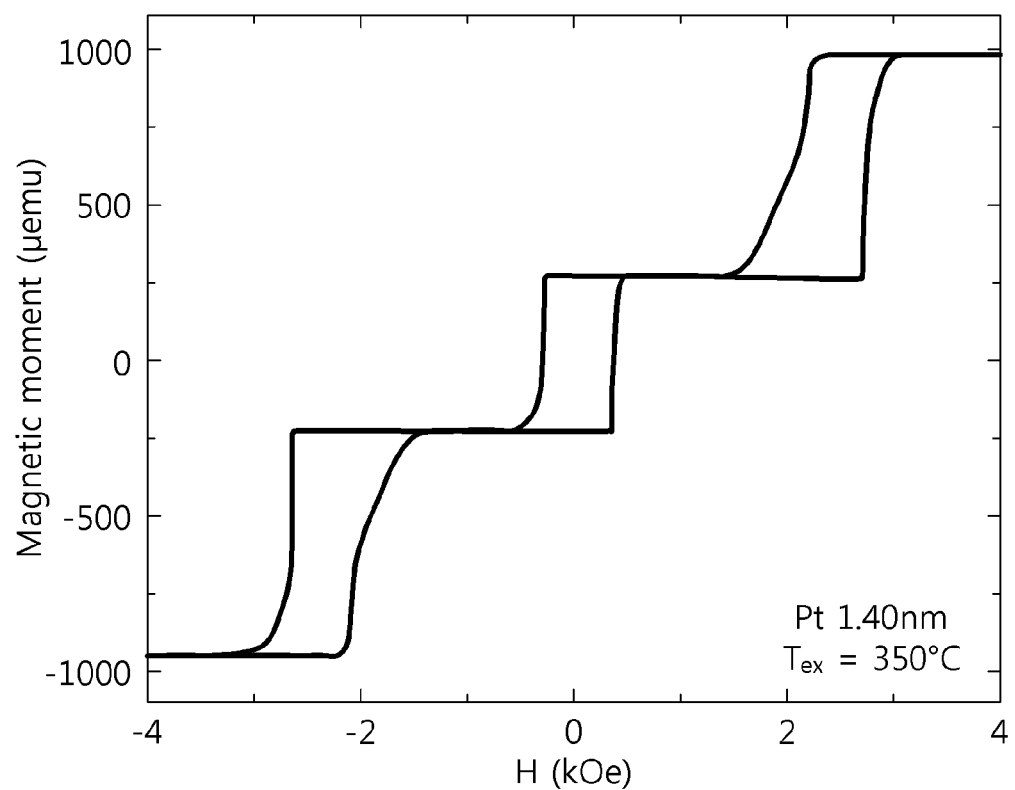

[FIG. 5D]
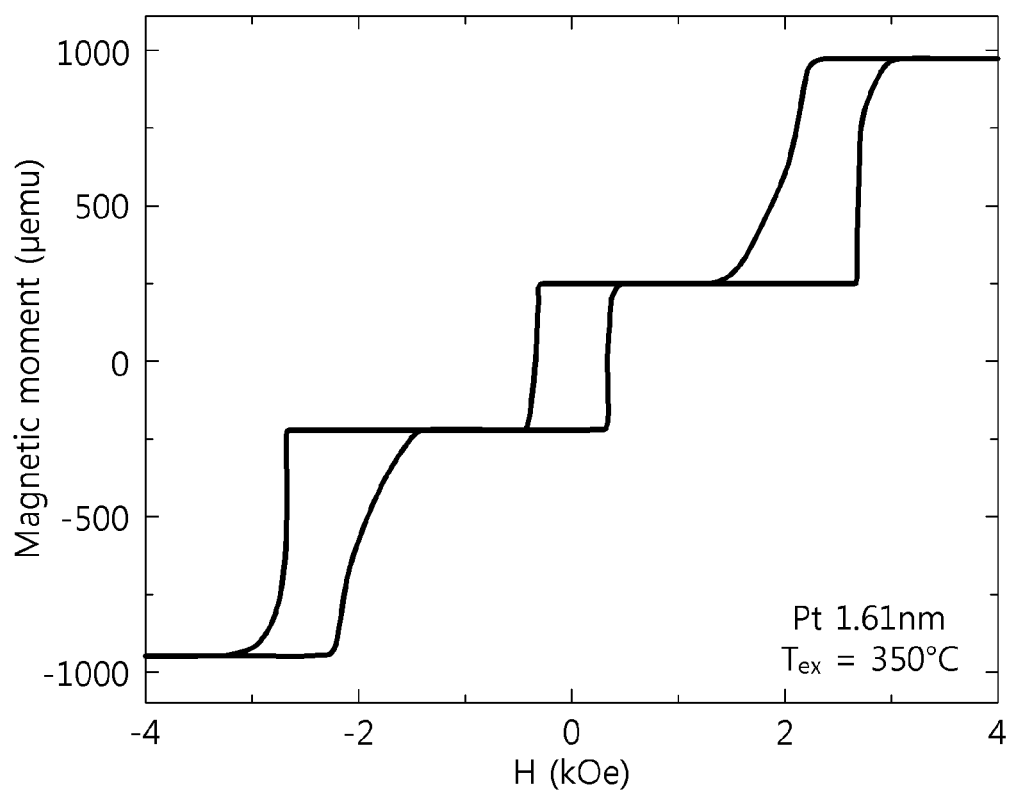

[FIG. 5E]
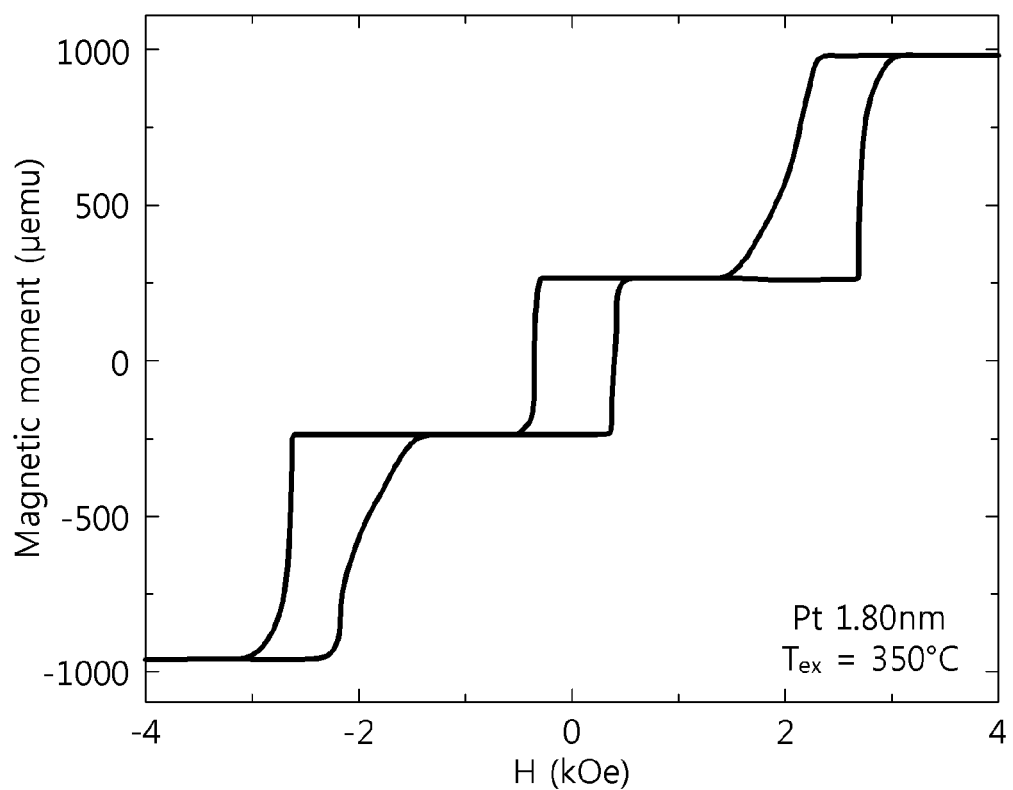

[FIG. 6A]
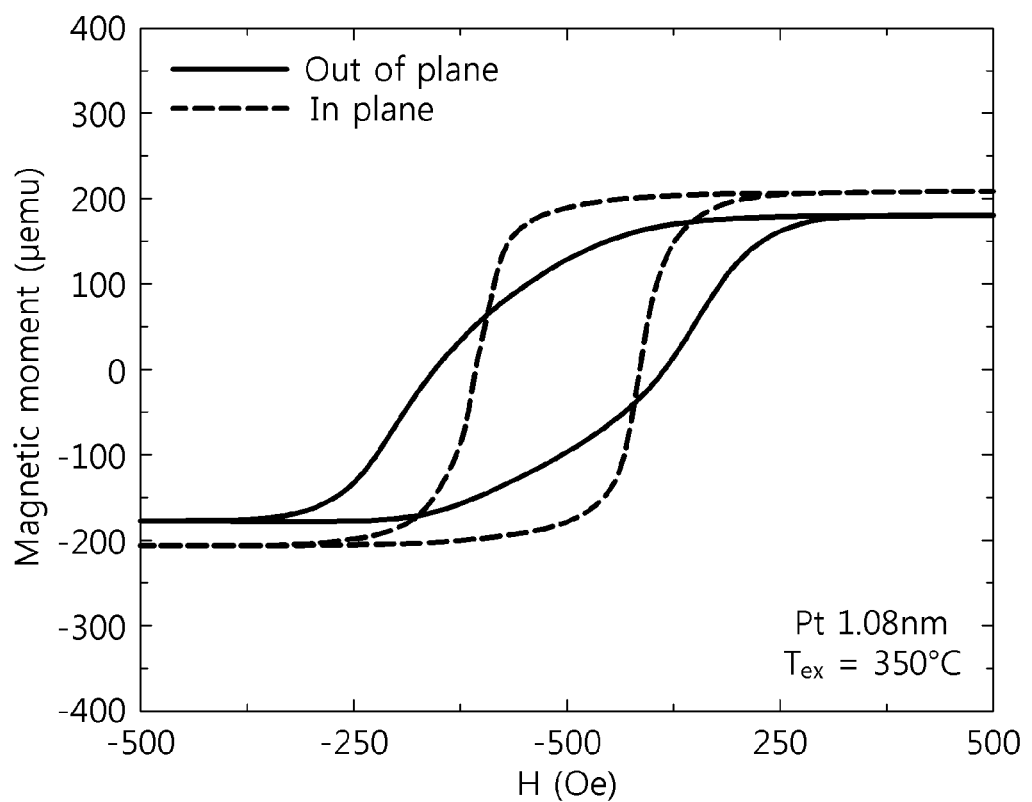

[FIG. 6B]
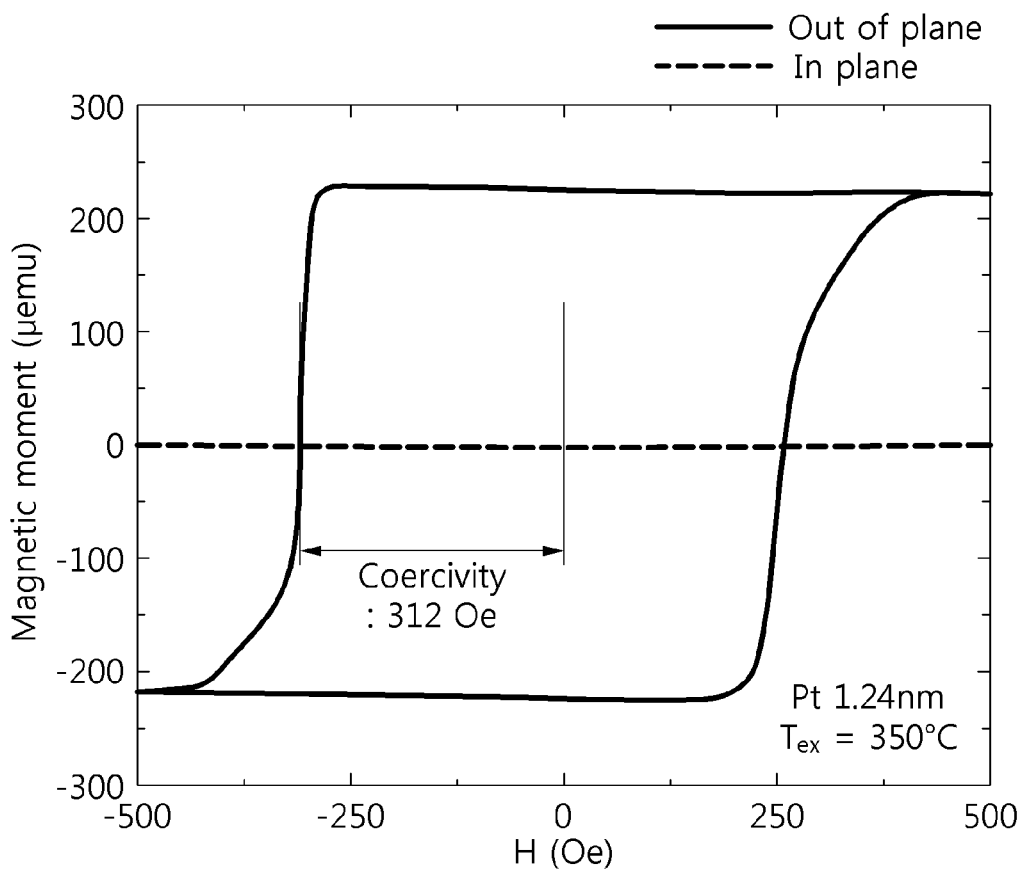

[FIG. 6C]
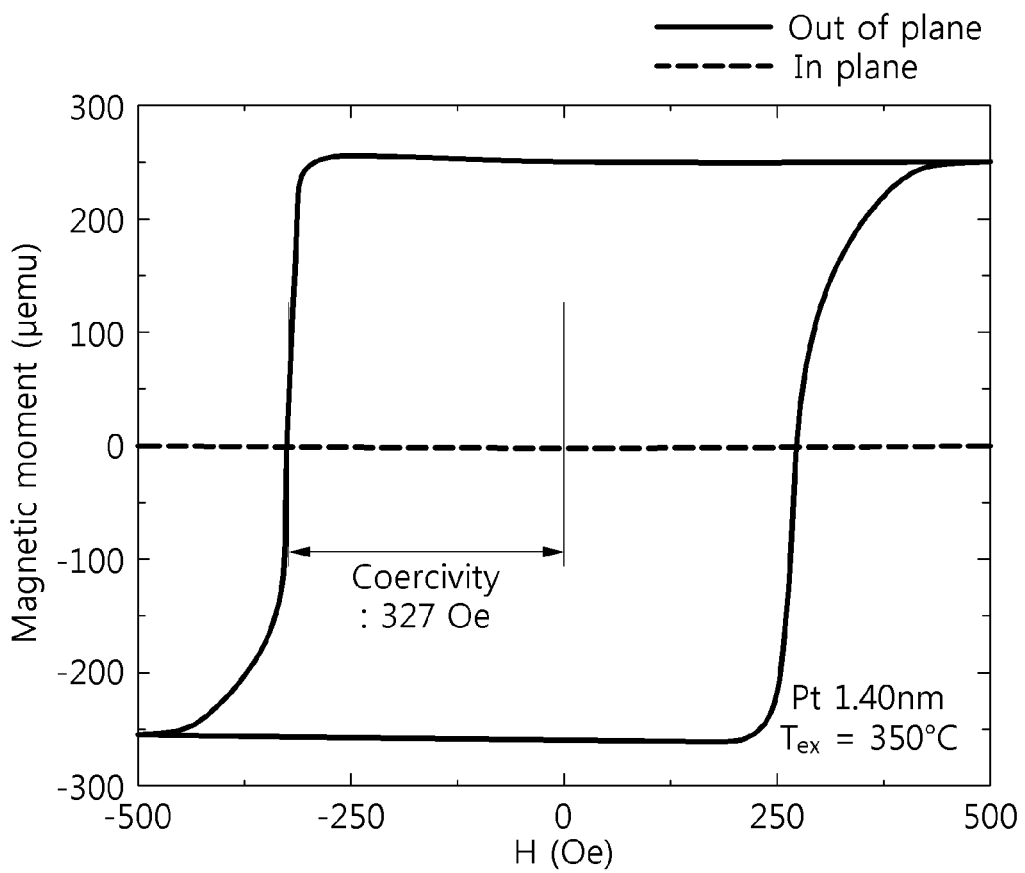

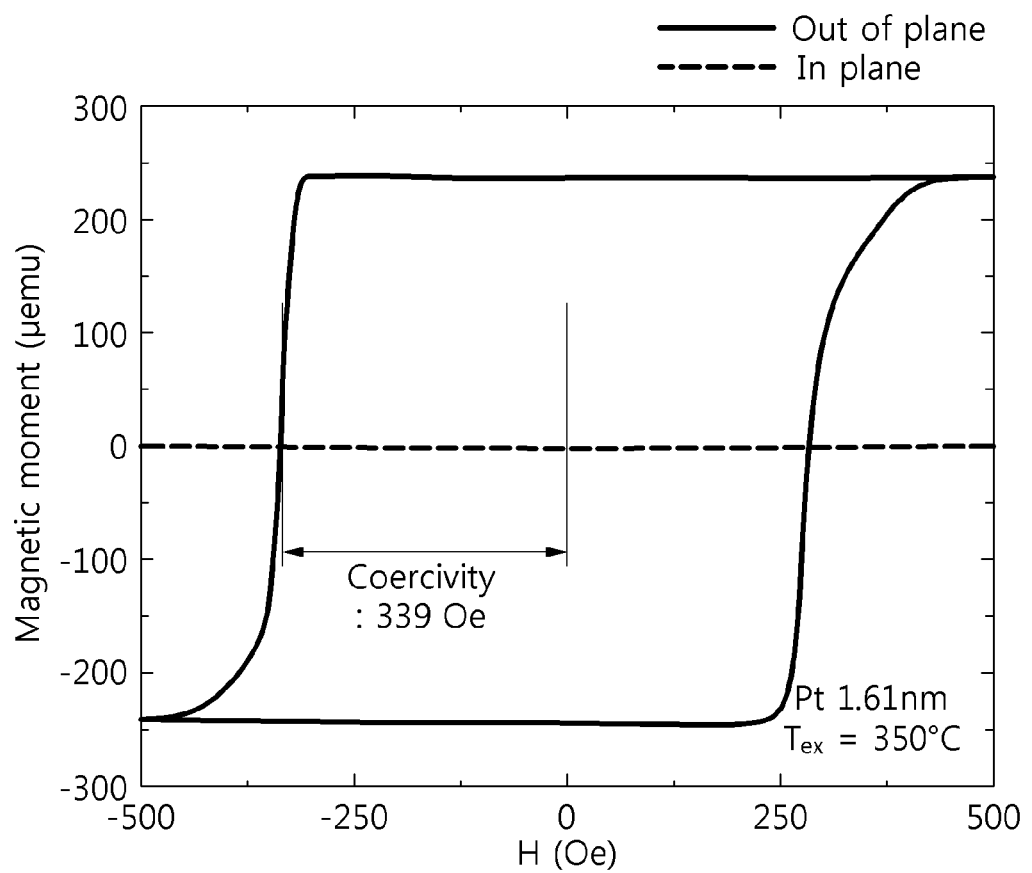
[FIG. 6D]

[FIG. 6E]
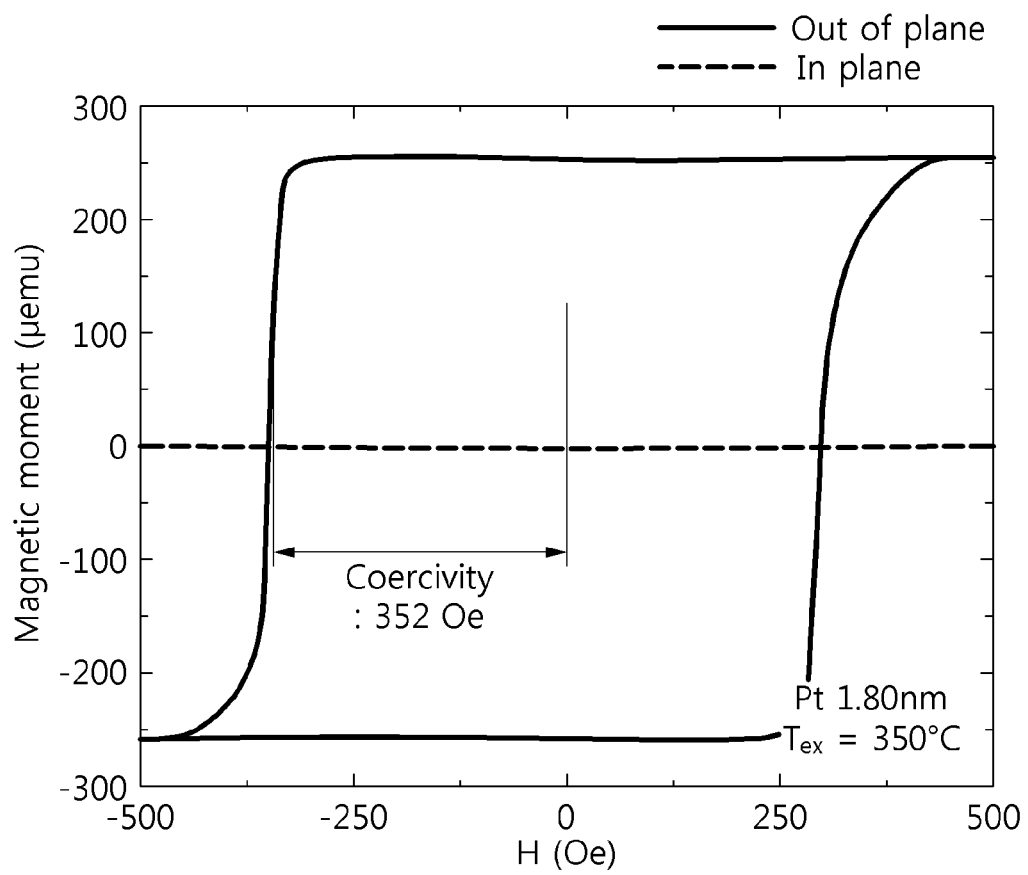

【FIG. 7】
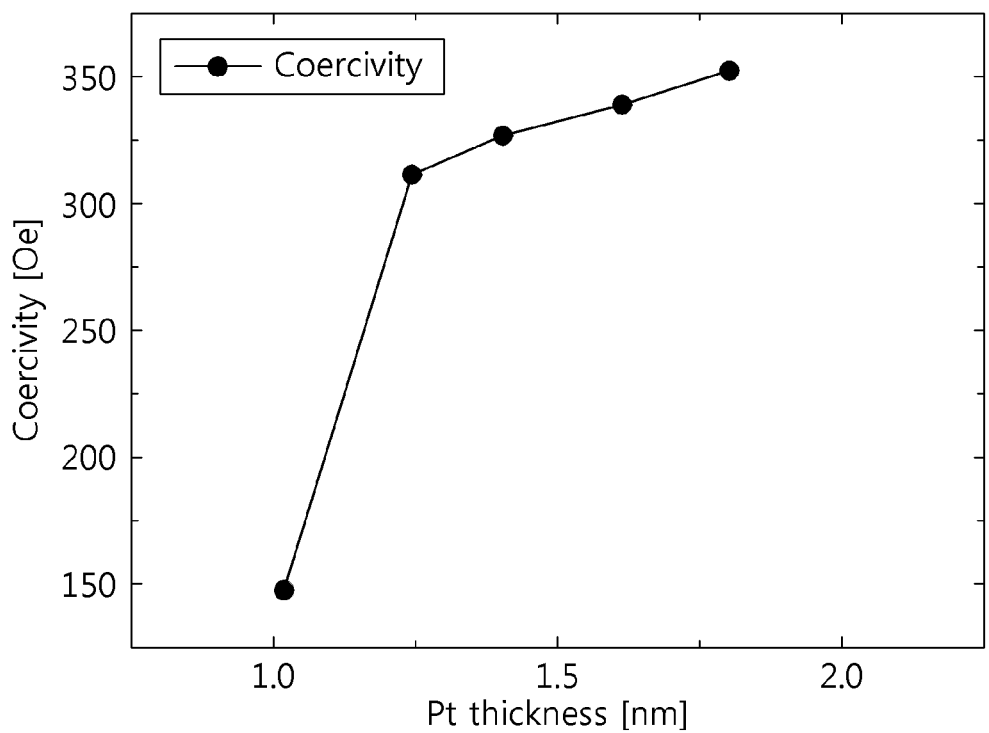

[FIG. 8A]
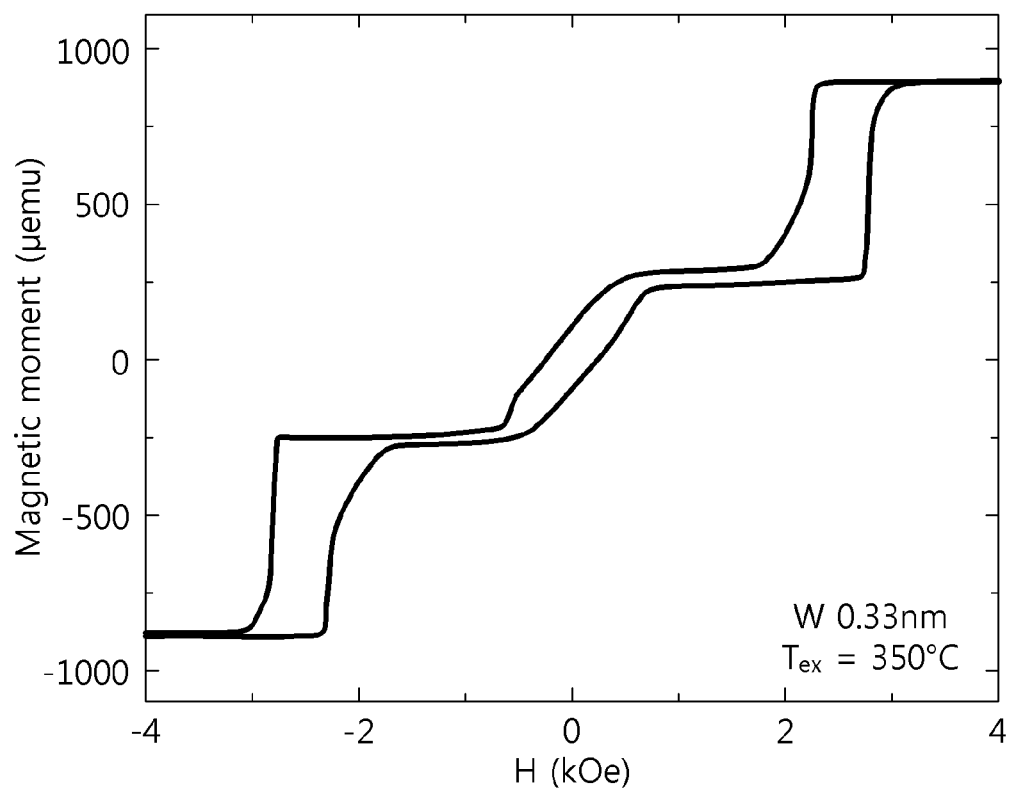

[FIG. 8B]
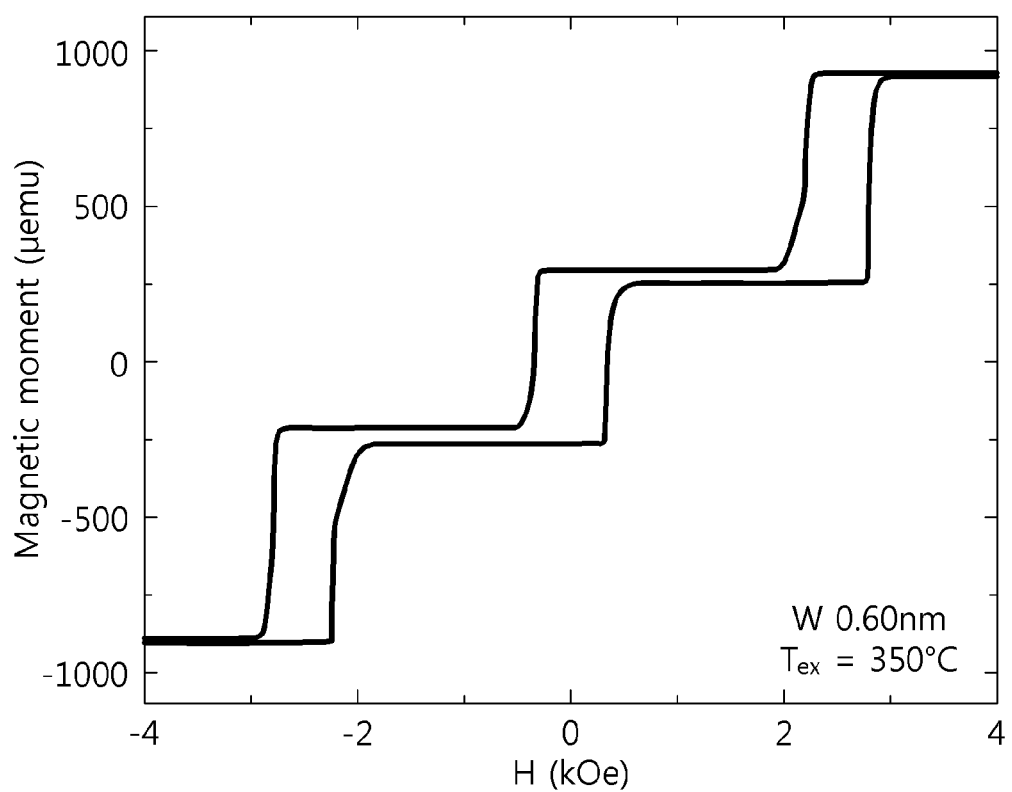

[FIG. 8C]
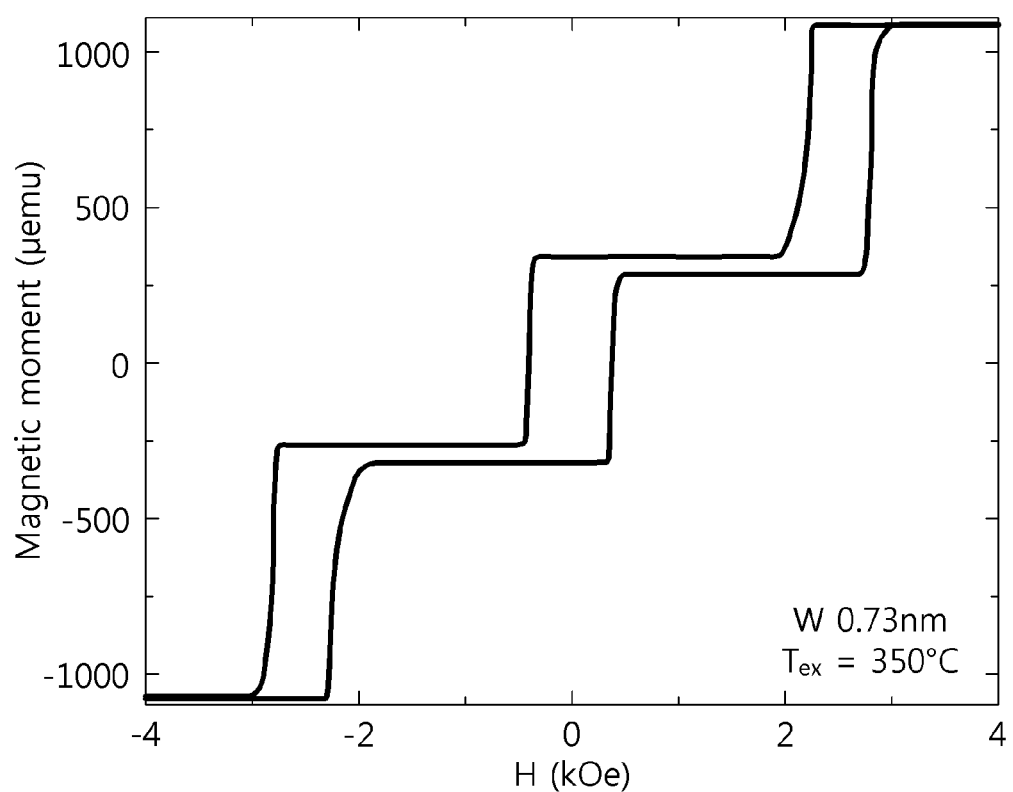

[FIG. 8D]
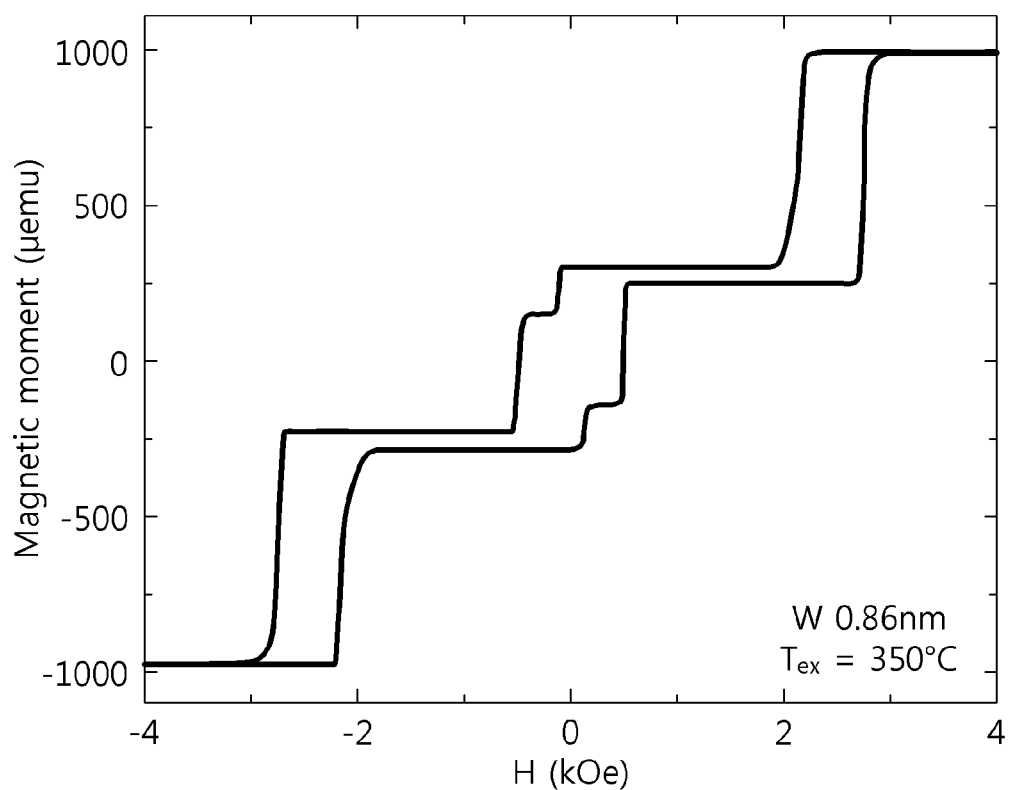

[FIG. 9A]
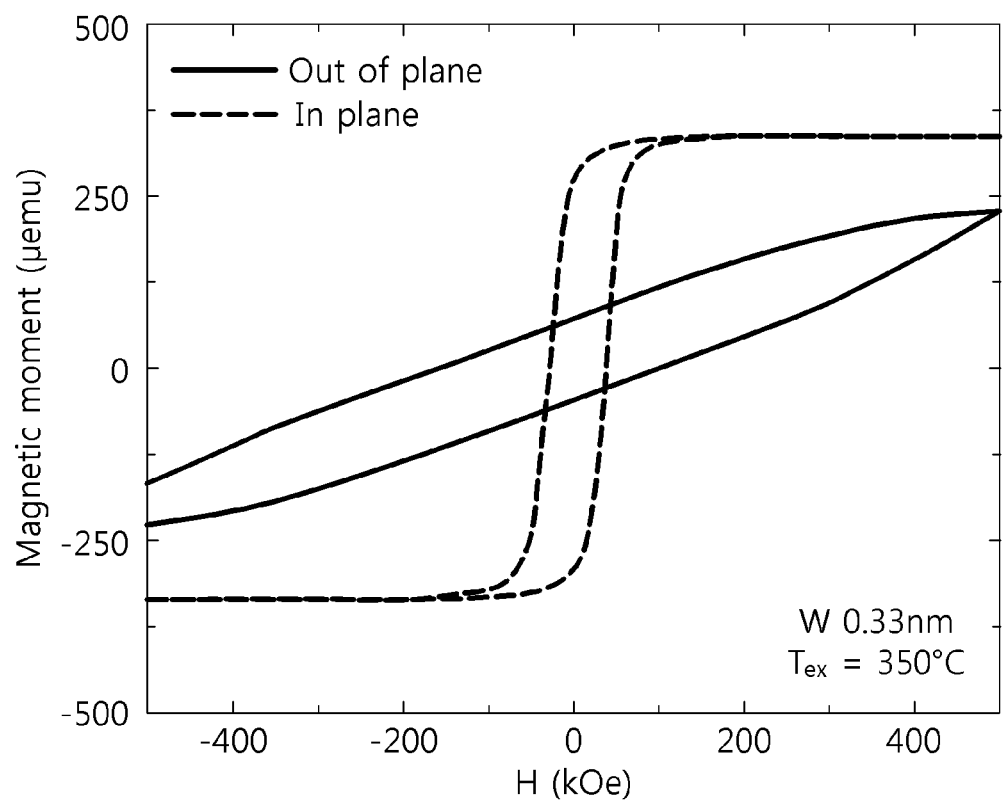

[FIG. 9B]
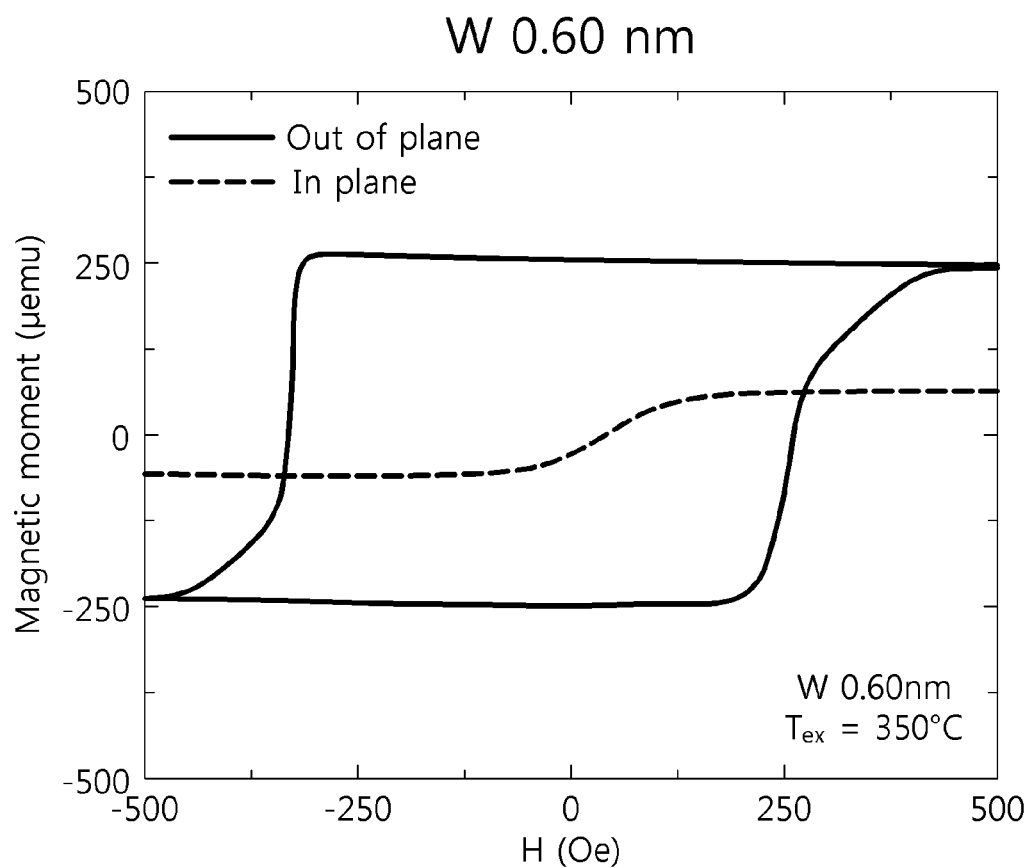

[FIG. 9C]
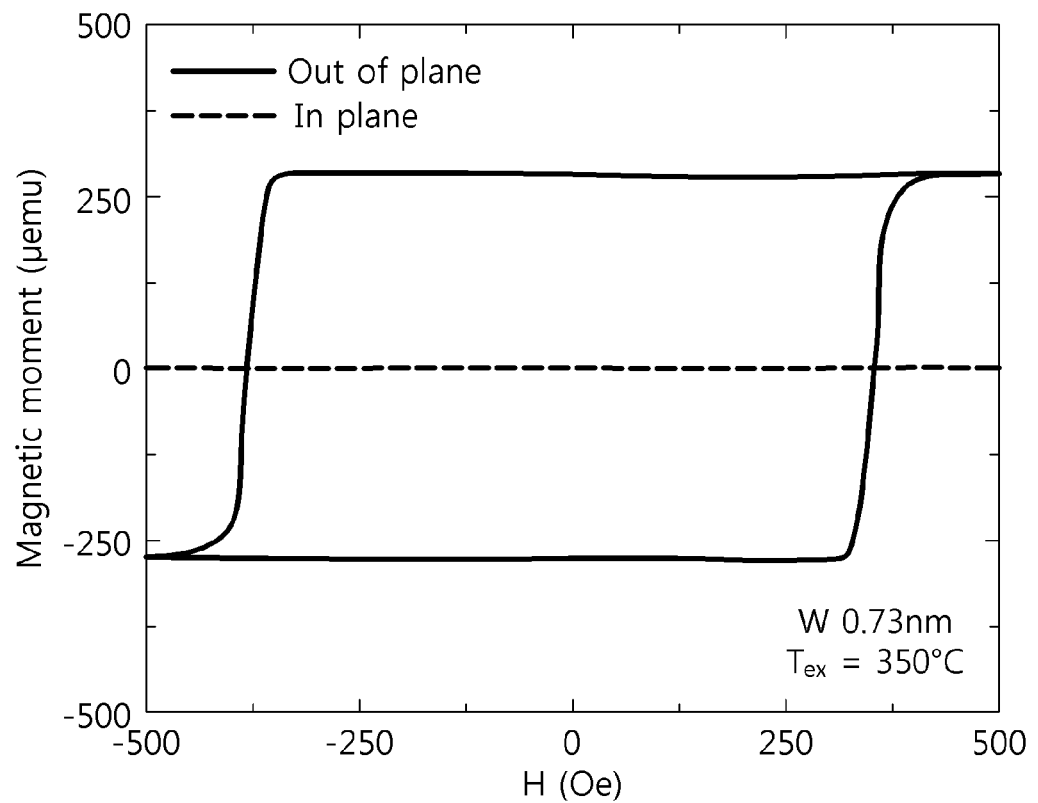

[FIG. 9D]
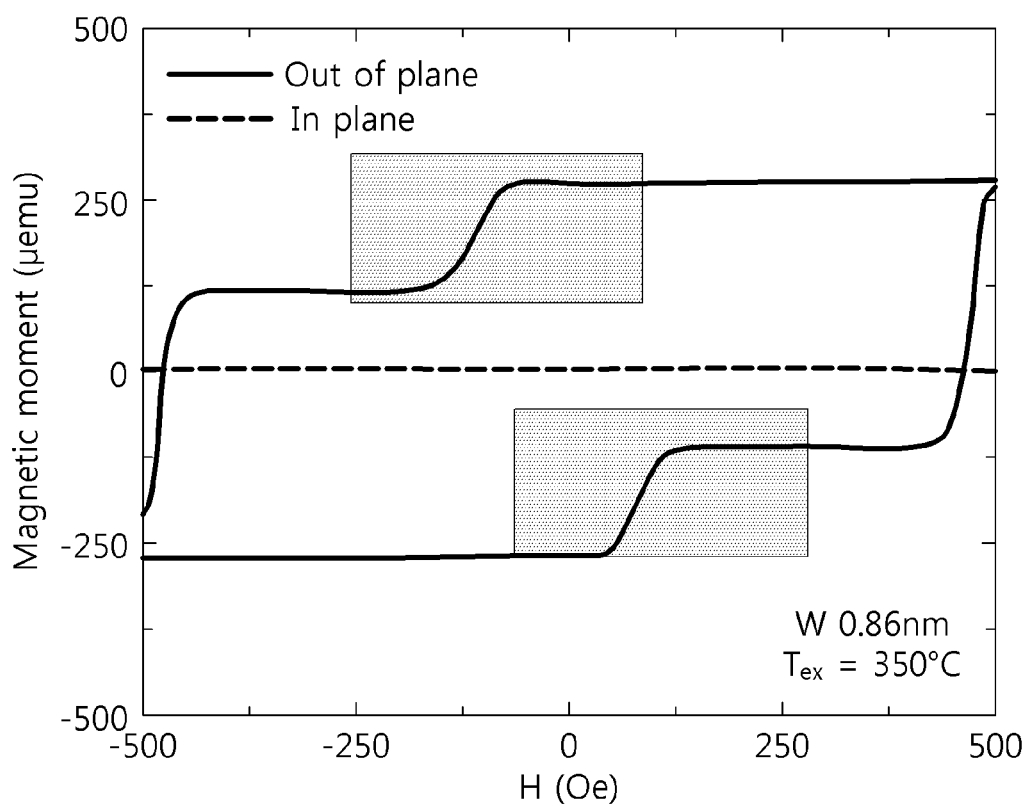

[FIG. 10]

| Top Electrode |
|---|
| Capping Layer Fe/W |
| Free Layer : [Co/Pt]n |
| Buffer Layer Pt |
| Bonding Layer Co |
| Spacer W |
| Free Layer : Fe/CoFeB |
| Tunnel Barrier : MgO |
| Seed Layer |
| TiN |
| W |
| $SiO_2$ |
| Si_Sub |

[FIG. 11A]
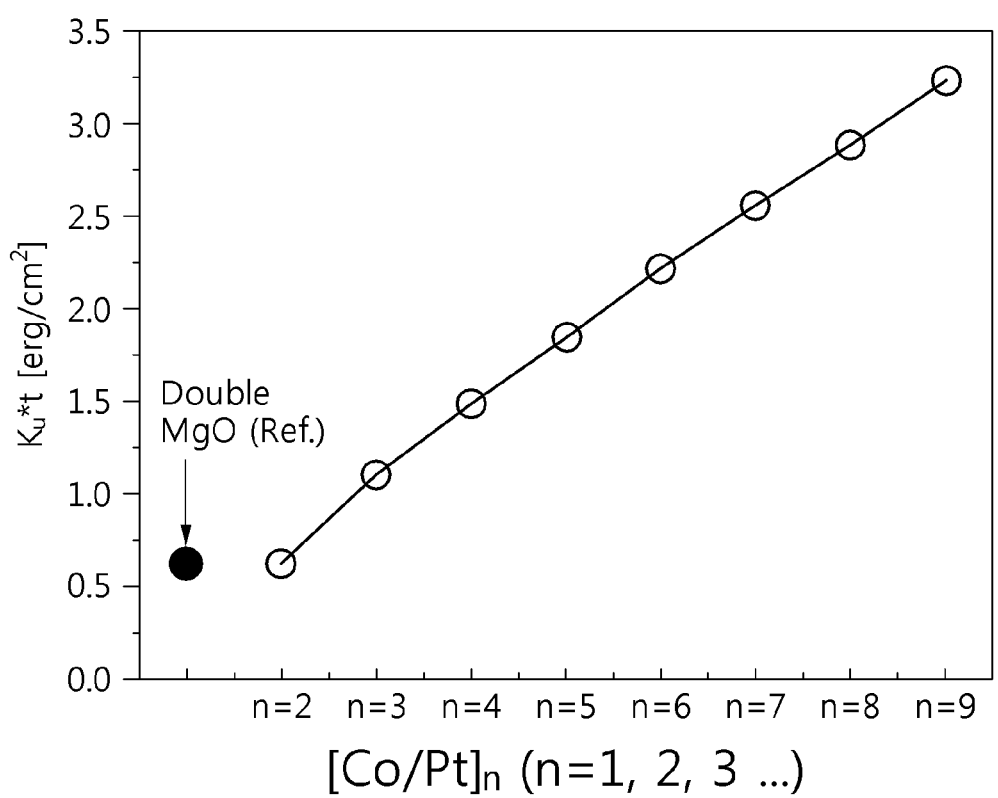

[FIG. 11B]
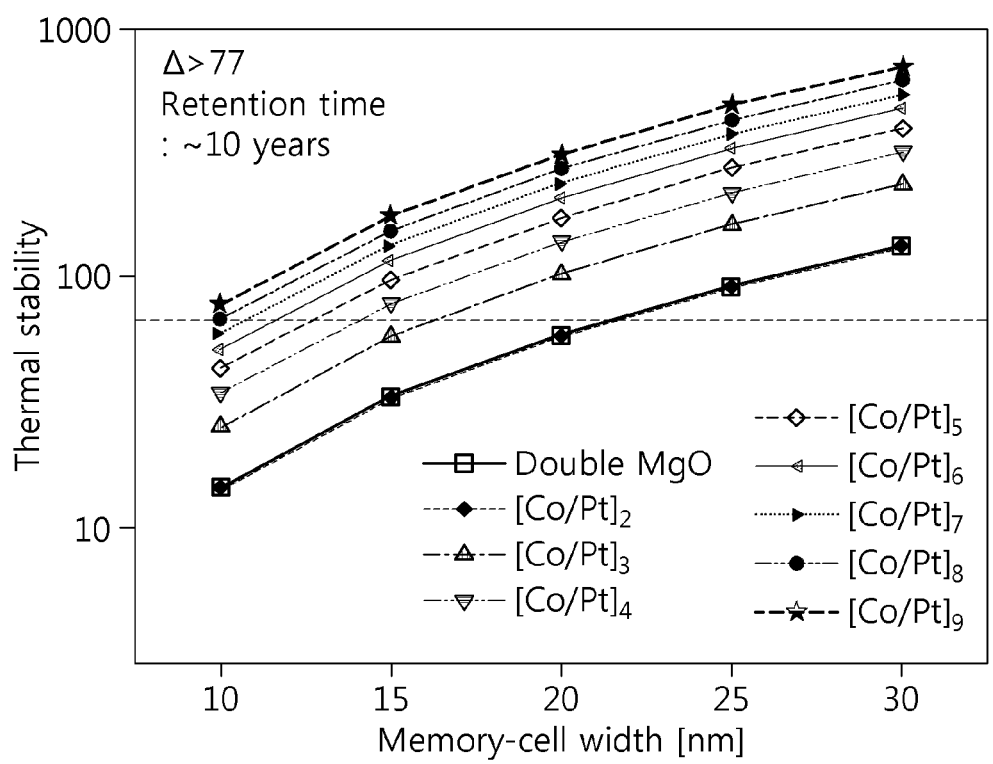

[FIG. 12A]
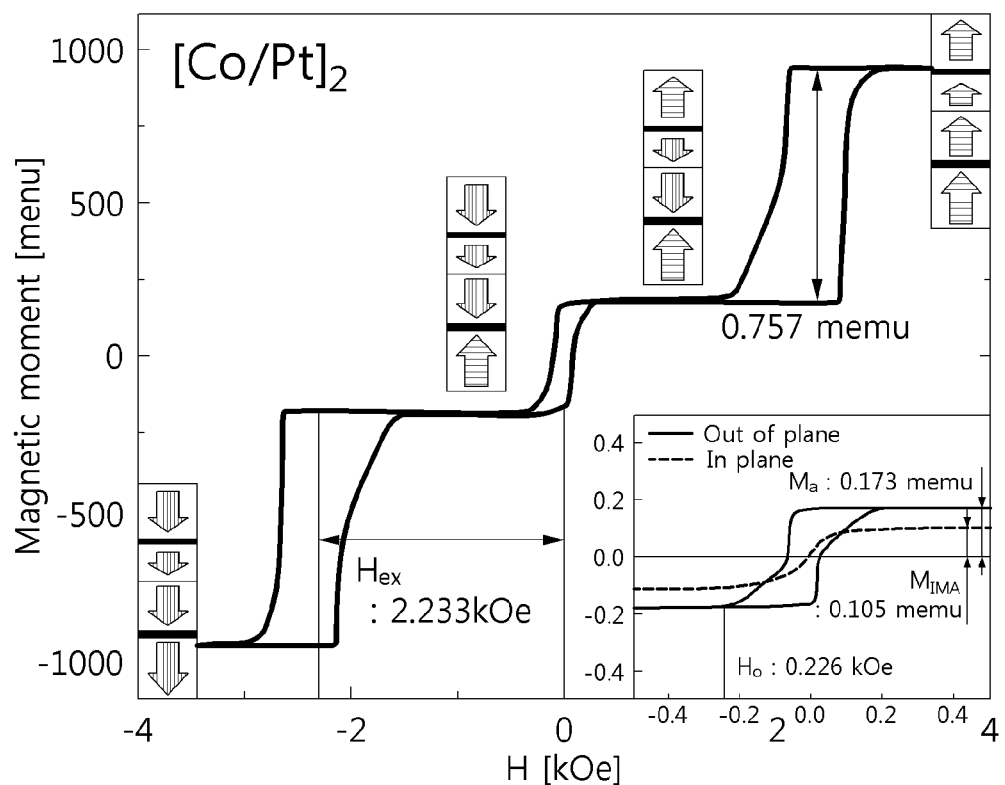

[FIG. 12B]
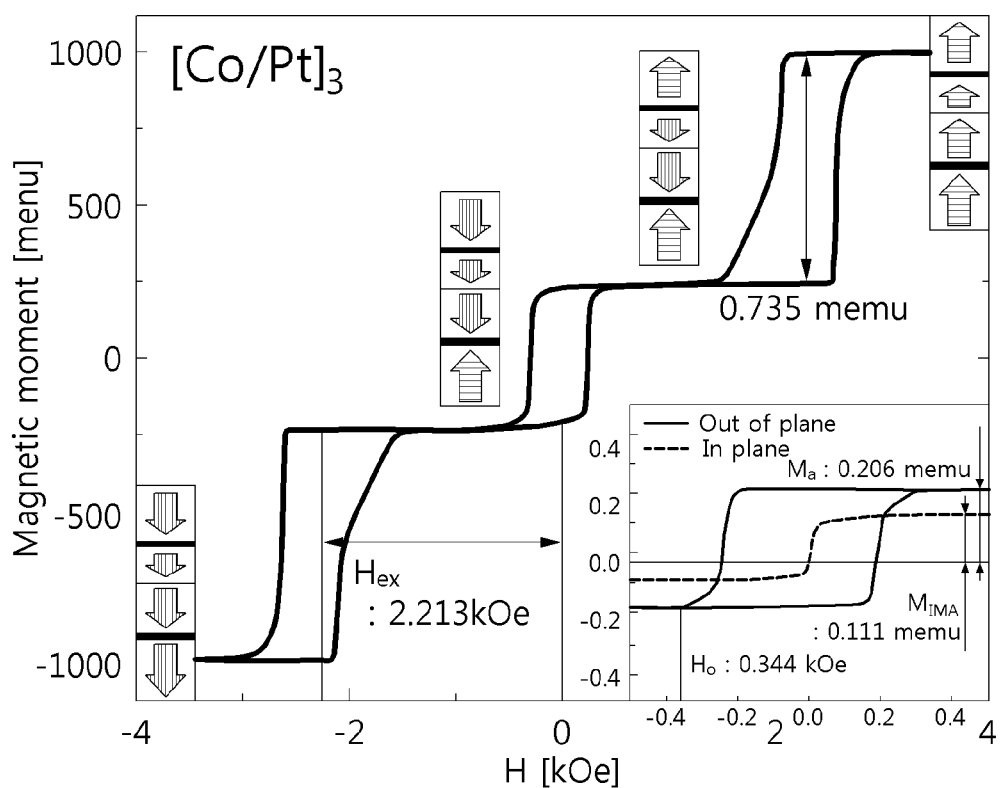

[FIG. 12C]
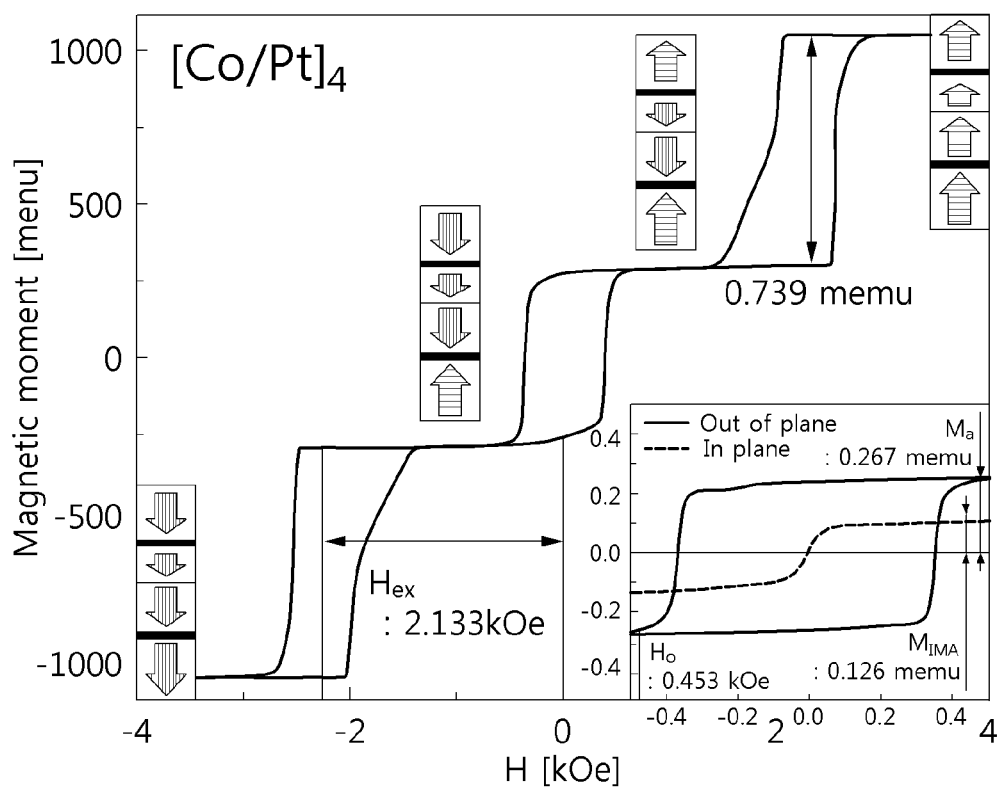

[FIG. 13]
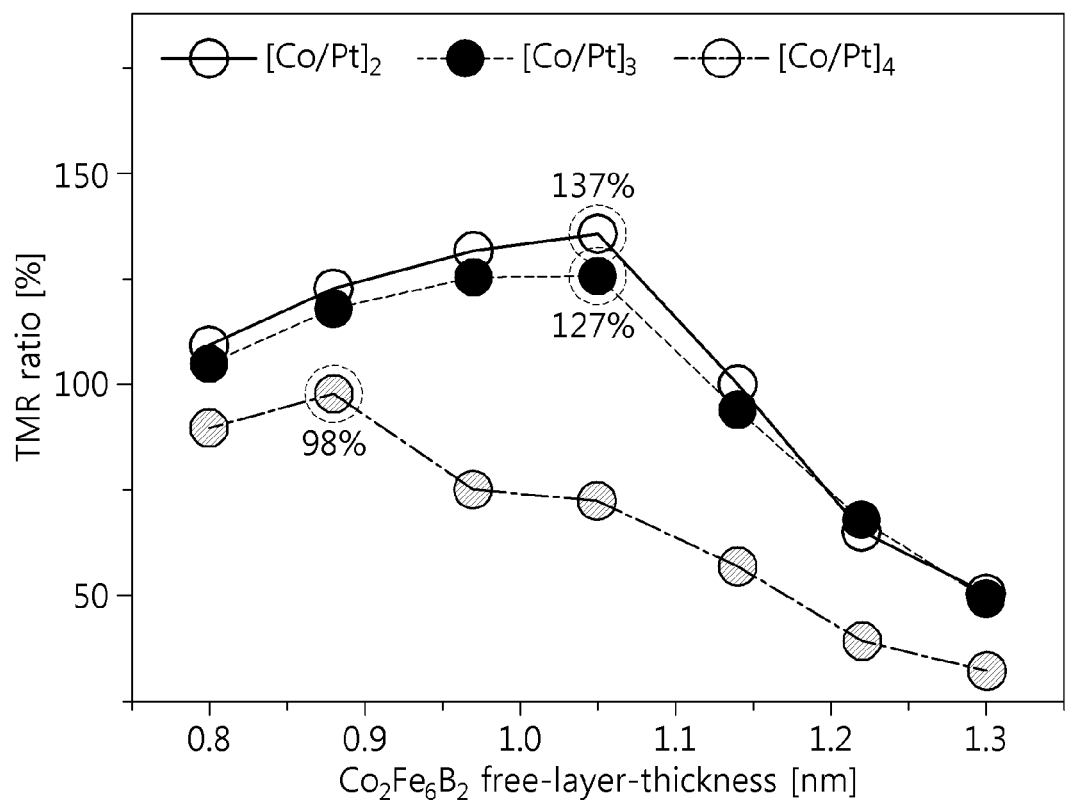

[FIG. 14]
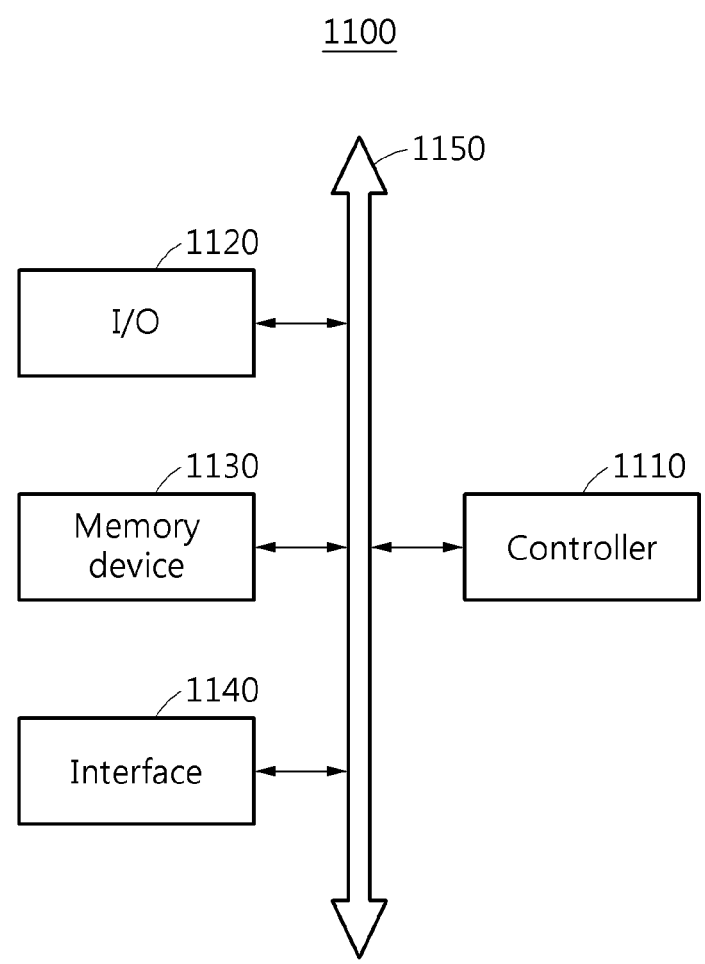

[FIG. 15]
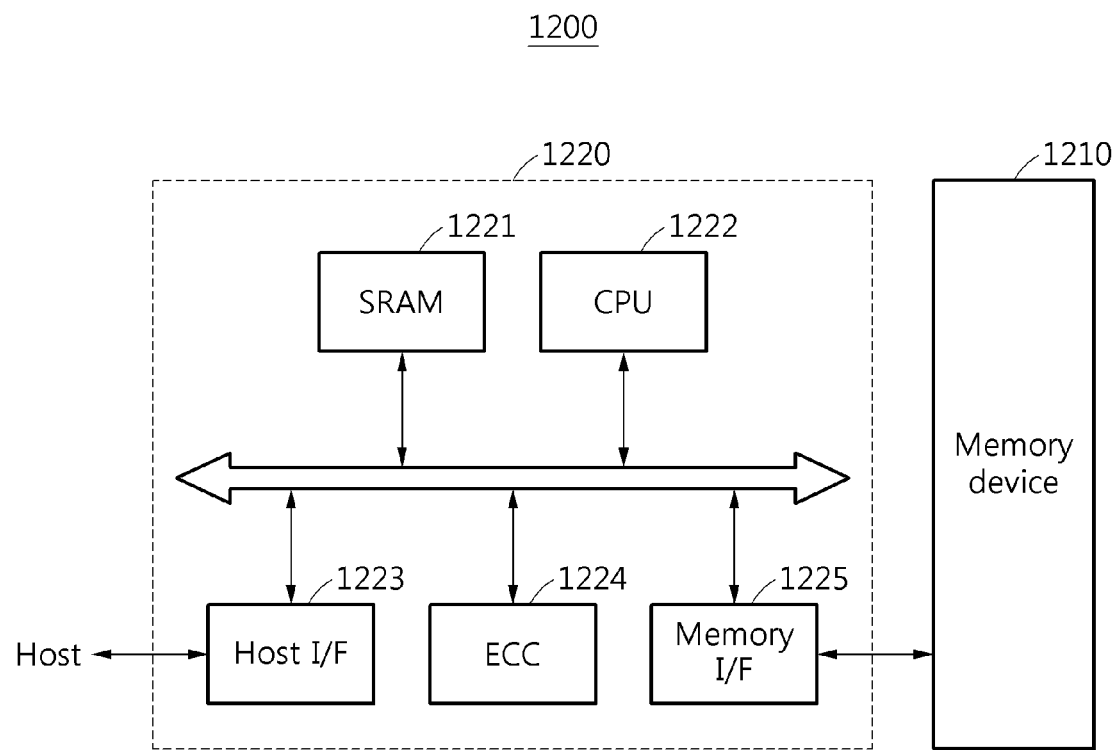

[FIG. 16]
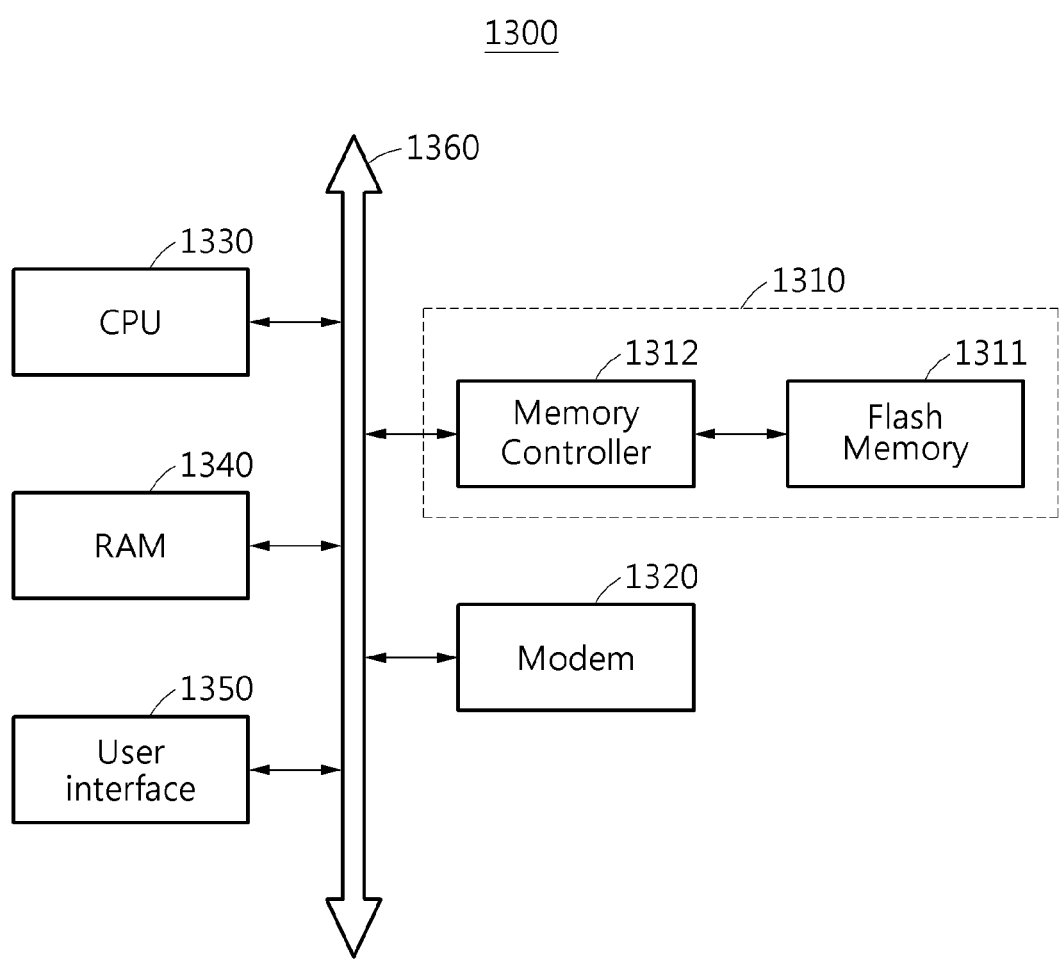

MEMORY DEVICE CONTAINING MAGNETIC TUNNEL JUNCTION

CROSS-REFERENCE TO RELATED APPLICATION

This application is a National Stage Entry of PCT International Application No. PCT/KR2019/014086, which was filed on Oct. 24, 2019, and claims priority to Korean Patent Application No. 10-2018-0145610, filed on Nov. 22, 2018 in the Korean Intellectual Property Office, the disclosure of which is incorporated herein by reference.

BACKGROUND OF THE DISCLOSURE

Field of the Disclosure

The present invention relates to a memory device, and more particularly, to a magnetic memory device using a magnetic tunnel junction (MTJ) including free layers having interface perpendicular magnetic anisotropy (i-PMA) and bulk perpendicular magnetic anisotropy (b-PMA).

Description of the Related Art

Next-generation non-volatile memory devices with lower power consumption and higher degree of integration than flash memory devices are being studied. Such next-generation non-volatile memory devices include phase-change random access memory (PRAM) that uses state changes of a phase change material such as chalcogenide alloys, magnetic random access memory (MRAM) that uses resistance changes in a magnetic tunnel junction (MTJ) depending on the magnetization state of a ferromagnetic material, ferroelectric random access memory (FRAM) that uses polarization of a ferroelectric material, resistance-change random access memory (ReRAM) that uses resistance changes in a variable resistance material, and the like.

Examples of MRAM include a spin-transfer torque magnetic random access memory (STT-MRAM) device that inverts magnetization using a spin-transfer torque (STT) phenomenon generated by electron injection and discriminates a resistance difference before and after magnetization inversion. The STT-MRAM device includes a magnetic tunnel junction, which consists of a pinned layer and a free layer, each formed of a ferromagnetic material, and a tunnel barrier disposed therebetween.

In the magnetic tunnel junction, when the magnetization directions of the free layer and the pinned layer are the same (that is, parallel), current flow is easy and consequently the magnetic tunnel junction is in a low resistance state. On the other hand, when the magnetization directions are different (that is, antiparallel), current is reduced and consequently the magnetic tunnel junction is in a high resistance state. In addition, in the magnetic tunnel junction, the magnetization directions must change only in the direction perpendicular to a substrate. Accordingly, the free layer and the pinned layer must have perpendicular magnetization values.

When the perpendicular magnetization values are symmetrical with respect to 0 according to the intensity and direction of a magnetic field, and a squareness (S) shape becomes clear (S=1), perpendicular magnetic anisotropy (PMA) is considered to be excellent. The STT-MRAM device is theoretically capable of cycling more than $10^{15}$ times and can be switched at a high speed of about a few nanoseconds (ns).

In particular, a perpendicular magnetization type STT-MRAM device is advantageous in that there is no theoretical scaling limit, and as scaling progresses, the current density of driving current may be lowered. Accordingly, the perpendicular magnetization type STT-MRAM device has been actively studied as a next-generation memory device that may replace DRAM devices. An example of the STT-MRAM device is disclosed in Korean Patent No. 10-1040163.

In the STT-MRAM device, a seed layer is formed on the lower part of the free layer, a capping layer is formed on the upper part of the pinned layer, and a synthetic antiferromagnetic (SyAF) layer and an upper electrode are formed on the upper part of the capping layer. In addition, in the STT-MRAM device, a silicon oxide film is formed on a silicon substrate, and then the seed layer and a magnetic tunnel junction are formed thereon. In addition, a selection element such as a transistor may be formed on the silicon substrate, and the silicon oxide film may be formed to cover the selection element.

Accordingly, the STT-MRAM device has a laminated structure in which the silicon oxide film, the seed layer, the free layer, the tunnel barrier, the pinned layer, the capping layer, the synthetic antiferromagnetic (SyAF) layer, and the upper electrode are laminated on the silicon substrate on which the selection element has been formed. In this case, the seed layer and the capping layer are formed using tantalum (Ta), and the synthetic antiferromagnetic (SyAF) layer has a structure consisting of lower and upper magnetic layers formed by alternately laminating a magnetic metal and a non-magnetic metal and a non-magnetic layer disposed therebetween.

However, currently reported magnetic tunnel junctions are based on a $SiO_2$ or MgO substrate, and have a structure without a lower electrode or a structure including a Ta/Ru lower electrode. However, to implement an STT-MRAM device, in the 1T1C structure of conventional DRAM, a capacitor must be replaced with a magnetic tunnel junction. In this case, a lower electrode must be formed using a material capable of reducing the resistance of a transistor and preventing the diffusion of a metal. However, considering grafting with a cell transistor, a magnetic tunnel junction fabricated using a conventional $SiO_2$ or MgO substrate cannot be directly applied to fabrication of a memory.

In addition, to implement an STT-MRAM device, switching energy must be low enough to cope with DRAM, but a lot of energy is required to rotate the spin of a free layer, making fabrication of a memory difficult.

In addition, high programming current density through an STT-MRAM cell is still a problem because high current density through a magnetic layer increases energy consumption of the cell and the thermal profile of the layer, which affects the integrity and reliability of the cell. In addition, when current density through the magnetic layer is high, the silicon area of each cell may increase.

Accordingly, to implement a highly integrated p-STT MRAM, an MTJ cell size must be scaled down to 10 nm. However, as the cell size decreases, thermal stability decreases, thereby reducing the reliability of stored input information.

SUMMARY OF THE DISCLOSURE

Therefore, the present invention has been made in view of the above problems, and it is one object of the present invention to provide a memory device with improved thermal stability by including a structure characterized in that free layers are formed by laminating a first free layer, a spacer layer, a coupling layer, a buffer layer, and a second free layer in sequential order.

More specifically, since the free layers include the buffer layer including a material having the FCC structure, as the buffer layer serves as a seed layer, the second free layer may grow in the FCC direction and the crystallinity of the second free layer may be improved.

In addition, since the free layers include the coupling layer, the buffer layer formed on the upper part of the coupling layer may be compensated, and ferromagnetic coupling between the first free layer and the second free layer may be increased.

In addition, since the free layers include the spacer layer, Ruderman-Kittel-Kasuya-Yosida (RKKY) coupling between the first free layer and the second free layer may be increased.

It is another object of the present invention to provide a memory device including free layers including a first free layer having interface perpendicular magnetic anisotropy (i-PMA) and a second free layer having bulk perpendicular magnetic anisotropy (b-PMA). Due to such a structure, perpendicular magnetic anisotropy may be enhanced, thereby increasing the thermal stability of the free layers and enhancing spin polarization, tunnel magnetoresistance (TMR), and spin-transfer torque.

It is yet another object of the present invention to provide a high capacity, highly integrated memory device including a second free layer having a multilayer structure, i.e., $[Co/Pt]_n$, in which a Co layer and a Pt layer are alternately laminated two or more times. Due to such a structure, anisotropy energy may be increased, thereby improving thermal stability.

In accordance with one aspect of the present invention, provided is a memory device including a lower electrode, a seed layer, a synthetic antiferromagnetic (SyAF) layer, a magnetic tunnel junction, and an upper electrode laminated on a substrate, wherein the magnetic tunnel junction includes a pinned layer, a tunnel barrier layer, and free layers, wherein the free layers include a first free layer, a spacer layer, a coupling layer, a buffer layer, and a second free layer laminated in sequential order.

The coupling layer may include a material having an HCP structure.

The material having an HCP structure may include cobalt (Co).

The buffer layer may include a material that allows the second free layer to grow in an FCC direction.

The buffer layer may include at least one of platinum (Pt), titanium (Ti), palladium (Pd), magnesium (Mg), cobalt (Co), aluminum (Al), and tungsten (W).

The first free layer may have a multilayer structure in which an Fe layer and a CoFeB layer are laminated.

The second free layer may have a multilayer structure in which a Co layer and a Pt layer are alternately laminated two or more times.

In the second free layer having the multilayer structure in which the Co layer and the Pt layer are laminated two or more times, the number of layers of the multilayer structure may be 3 to 9.

The Co layer of the second free layer may have a thickness of 0.2 nm to 0.6 nm.

The Pt layer of the second free layer may have a thickness of 0.2 nm to 0.6 nm.

The coupling layer may have a thickness of 0.1 nm to 0.6 nm.

The buffer layer may have a thickness of 1.0 nm to 3.0 nm.

The spacer layer may have a thickness of 0.3 nm to 0.8 nm.

The lower electrode may have a laminated structure in which a first lower electrode including tungsten (W) and a second lower electrode including titanium nitride (TiN) are laminated.

The memory device may further include a bridge layer between the synthetic antiferromagnetic (SyAF) layer and the magnetic tunnel junction.

The memory device may further include a capping layer between the magnetic tunnel junction and the upper electrode.

According to an embodiment of the present invention, a memory device with improved thermal stability by including a structure characterized in that free layers are formed by laminating a first free layer, a spacer layer, a coupling layer, a buffer layer, and a second free layer in sequential order, can be provided.

More specifically, since the free layers include the buffer layer including a material having the FCC structure, as the buffer layer serves as a seed layer, the second free layer can grow in the FCC direction and the crystallinity of the second free layer can be improved.

In addition, since the free layers include the coupling layer, the buffer layer formed on the upper part of the coupling layer can be compensated, and ferromagnetic coupling between the first free layer and the second free layer can be increased.

In addition, since the free layers include the spacer layer, Ruderman-Kittel-Kasuya-Yosida (RKKY) coupling between the first free layer and the second free layer can be increased.

According to an embodiment of the present invention, a memory device including free layers including a first free layer having interface perpendicular magnetic anisotropy (i-PMA) and a second free layer having bulk perpendicular magnetic anisotropy (b-PMA) can be provided. Due to such a structure, perpendicular magnetic anisotropy can be enhanced, thereby increasing the thermal stability of the free layers and enhancing spin polarization, tunnel magnetoresistance (TMR), and spin-transfer torque.

According to an embodiment of the present invention, a high capacity, highly integrated memory device including a second free layer having a multilayer structure in which a Co layer and a Pt layer are alternately laminated two or more times can be provided. Due to such a structure, anisotropy energy can be increased, thereby improving thermal stability.

BRIEF DESCRIPTION OF THE DRAWINGS

FIG. 1 is a cross-sectional view of a conventional memory device.

FIG. 2 is a cross-sectional view of the memory device according to an embodiment of the present invention.

FIGS. 3A to 3E and FIGS. 4A to 4E are graphs showing the magnetic properties of the memory device according to an embodiment of the present invention depending on the thickness of the coupling layer of the memory device.

FIGS. 5A to 5E and FIGS. 6A to 6E are graphs showing the magnetic properties of the memory device according to an embodiment of the present invention depending on the thickness of the buffer layer of the memory device.

FIG. 7 is a graph showing coercivity depending on the thickness of the spacer layer of the memory device according to an embodiment of the present invention.

FIGS. 8A to 8D and FIGS. 9A to 9D are graphs showing the magnetic properties of the memory device according to an embodiment of the present invention depending on the thickness of the spacer layer of the memory device.

FIG. 10 illustrates the structure of the free layers of the memory device according to an embodiment of the present invention.

FIG. 11A is a graph showing the anisotropy energy of a conventional memory device and the memory device according to an embodiment of the present invention, and FIG. 11B is a graph showing thermal stability depending on the number of lamination of the second free layer of the memory device according to an embodiment of the present invention.

FIGS. 12A to 12C are graphs showing magnetization curves depending on the number of lamination of the second free layer of the memory device according to an embodiment of the present invention.

FIG. 13 is a graph showing the tunnel magnetoresistance (TMR) of the memory device according to an embodiment of the present invention.

FIG. 14 is a schematic block diagram showing an example of a memory system including the memory device according to an embodiment of the present invention.

FIG. 15 is a schematic block diagram showing an example of a memory card including a memory device according to an embodiment of the present invention.

FIG. 16 is a schematic block diagram showing an example of an information processing system including the memory device according to an embodiment of the present invention.

DETAILED DESCRIPTION OF THE DISCLOSURE

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless mentioned otherwise or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless defined otherwise, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

In addition, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

FIG. 1 is a cross-sectional view of a conventional memory device.

The conventional memory device includes a lower electrode 110, a seed layer 120, a synthetic antiferromagnetic (SyAF) layer 130, a bridge layer 140, a magnetic tunnel junction, a capping layer 210, and an upper electrode 220 laminated on a substrate 100 in sequential order. In this case, in the magnetic tunnel junction, a pinned layer 150, a tunnel barrier layer 160, a first free layer 171, a spacer layer 180, and a second free layer 172 are laminated in sequential order.

The perpendicular characteristics of a memory device mainly depend on texturing in the BCC (100) direction of a magnetic tunnel junction of CoFeB/MgO/CoFeB, and the memory device has amorphous/BCC (100)/amorphous crystallinity in a sputtered state. Thus, to exhibit perpendicular anisotropy characteristics, as B of amorphous CoFeB diffuses into the bridge layer (W) 140 and the capping layer 210 through external heat treatment, the interface perpendicular magnetic anisotropy (i-PMA) characteristics are exhibited by orbital mixing of Fe of CoFeB and O of MgO, and CFB/MgO/CFB of the magnetic tunnel junction are textured in the BCC 100 direction.

In this case, in addition to absorbing B, the bridge layer (Ta) 140 may serve as a supplementary layer for the FCC (111) structure of the synthetic antiferromagnetic layer 130.

The synthetic antiferromagnetic layer 130 serves to stabilize the magnetic properties of the pinned layer 150 and includes a non-magnetic layer for magnetic exchange coupling between the first magnetic layer and the second magnetic layer.

In addition, the conventional memory device includes the first free layer 171, the spacer layer 180, and the second free layer 172 as free layers, that is includes dual free layers. Thus, the conventional memory device may have high thermal stability compared to a structure including a single storage layer.

However, to implement highly integrated p-STT MRAM, the size of an MTJ cell must be scaled down to 10 nm, but as the cell size decreases, thermal stability decreases and the reliability of stored input information decreases.

According to the present invention, by forming a spacer layer, a coupling layer, and a buffer layer between the dual free layers of the conventional memory device and forming a second free layer having a multilayer structure, thermal stability may be further improved.

FIG. 2 is a cross-sectional view of the memory device according to an embodiment of the present invention.

The memory device according to an embodiment of the present invention includes a lower electrode 110, a seed layer 120, a synthetic antiferromagnetic layer 130, a magnetic tunnel junction, and an upper electrode 220 laminated on the substrate 100. In this case, the magnetic tunnel junction includes a pinned layer 150, a tunnel barrier layer 160, and free layers. In this case, the free layers include a first free layer 171, a spacer layer 180, a coupling layer 190, a buffer layer 200, and a second free layer 172 laminated in sequential order.

The substrate 100 may be a semiconductor substrate. For example, as the substrate 100, a silicon substrate, a gallium arsenide substrate, a silicon germanium substrate, a silicon oxide film substrate, or the like may be used. In the memory device according to an embodiment of the present invention, a silicon substrate may be used. In addition, a selection element including a transistor may be formed on the substrate 100.

According to an embodiment, an insulating layer 105 may be formed on the substrate 100. The insulating layer 105 may be formed to cover predetermined structures such as a selection element, and may be provided with a contact hole exposing at least a part of the selection element. The insulating layer 105 may be formed using a silicon oxide ($SiO_2$) film having an amorphous structure.

The lower electrode 110 is formed on the insulating layer 105. The lower electrode 110 may be formed using a conductive material, such as metals and metal nitrides.

In addition, the memory device according to an embodiment of the present invention may be formed in a dual structure of first and second lower electrodes 111 and 112. The first lower electrode 111 may be formed on the insulating layer 105, and the second lower electrode 112 may be formed on the first lower electrode 111. In addition, the first lower electrode 111 may be formed inside the insulating layer 105, and thus may be connected to a selection element formed on the substrate 100.

The first and second lower electrodes 111 and 112 may be formed of a polycrystalline material. Thus, the first and second lower electrodes 111 and 112 may be formed of a conductive material having the BCC structure. For example, the first lower electrode 111 may be formed of a metal such as tungsten (W), and the second lower electrode 112 may be formed of a metal nitride such as titanium nitride (TiN).

Preferably, in the memory device according to an embodiment of the present invention, the lower electrode 110 may have a laminated structure in which the first lower electrode 111 including tungsten (W) and the second lower electrode 112 including TiN are laminated.

Since the first and second lower electrodes 111 and 112 are formed of a polycrystalline material, the crystallinity of a subsequently formed magnetic tunnel junction may be improved. Accordingly, when the first and second lower electrodes 111 and 112 are formed, an amorphous magnetic tunnel junction formed thereon grows in the crystal direction of the first lower electrode 111. Subsequently, when heat treatment is performed to obtain perpendicular anisotropy, the crystallinity of the magnetic tunnel junction may be improved compared to a conventional case.

Accordingly, according to the conventional case, since an amorphous seed layer and an amorphous magnetic tunnel junction are formed on an amorphous insulating layer, even when heat treatment is performed, crystallinity is less improved compared to the case of the present invention. When the crystallinity of the magnetic tunnel junction is increased, the degree of magnetization generated when a magnetic field is applied may increase, and current flowing through the magnetic tunnel junction in a parallel state may increase. Accordingly, when the magnetic tunnel junction is applied to a memory device, the operating speed and reliability of the memory device may be increased.

The seed layer 120 is formed on the lower electrode 110. The seed layer 120 may be formed of a material allowing crystal growth of the synthetic antiferromagnetic layer 130. Accordingly, the seed layer 120 may allow first and second magnetic layers 131 and 133 of the synthetic antiferromagnetic layer 130 to grow in a desired crystal direction. For example, the seed layer 120 may be formed of a material that facilitates crystal growth in the (111) direction of a face-centered cubic (FCC) lattice or the (001) direction of a hexagonal close-packed (HCP) structure.

The seed layer 120 may include tantalum (Ta), ruthenium (Ru), titanium (Ti), palladium (Pd), platinum (Pt), magnesium (Mg), cobalt (Co), aluminum (Al), tungsten (W), or alloys thereof. Preferably, the seed layer 120 may be formed of platinum (Pt) to have a thickness of 1 nm to 3 nm.

The synthetic antiferromagnetic layer 130 is formed on the seed layer 120. The magnetization direction of the synthetic antiferromagnetic layer 130 may be fixed, and the synthetic antiferromagnetic layer 130 serves to fix the magnetization of the pinned layer 150.

The synthetic antiferromagnetic layer 130 may include the first magnetic layer 131, a non-magnetic layer 132, and the second magnetic layer 133. That is, in the synthetic antiferromagnetic layer 130, the first and second magnetic layers 131 and 133 are antiferromagnetically coupled via the non-magnetic layer 132. In addition, the first and second magnetic layers 131 and 133 may have crystals oriented in the FCC (111) direction or the HCP (001) direction.

In addition, the magnetization directions of the first and second magnetic layers 131 and 133 are arranged antiparallel. For example, the first magnetic layer 131 may be magnetized in the upward direction (i.e., the direction toward the upper electrode 220), and the second magnetic layer 133 may be magnetized in the downward direction (i.e., the direction toward the substrate 100).

The first and second magnetic layers 131 and 133 may be formed by alternately laminating a magnetic metal and a non-magnetic metal. A single metal selected from the group consisting of iron (Fe), cobalt (Co), and nickel (Ni) or an alloy thereof may be used as the magnetic metal, and a single metal selected from the group consisting of chromium (Cr), platinum (Pt), palladium (Pd), iridium (Ir), rhodium (Rh), ruthenium (Ru), osmium (Os), rhenium (Re), gold (Au), and copper (Cu) or an alloy thereof may be used as the non-magnetic metal. For example, the first and second magnetic layers 131 and 133 may be formed of $[Co/Pd]_x$, $[Co/Pt]_x$, or $[CoFe/Pt]_x$ (wherein x is an integer of 1 or more), preferably $[Co/Pt]_x$ (wherein x is an integer of 1 or more).

In addition, in the memory device according to an embodiment of the present invention, the first magnetic layer 131 of the synthetic antiferromagnetic layer 130 may be formed by laminating [Co/Pt] 3 to 6 times, and the second magnetic layer 133 may be formed by laminating [Co/Pt] 0 to 3 times. Accordingly, the first magnetic layer 131 may be formed thicker than the second magnetic layer 133.

For example, the first and second magnetic layers 131 and 133 may be formed to have the same thickness by laminating the same material a plurality of times. In this case, the number of times of lamination may be larger at the time of forming the first magnetic layer 131 as compared to at the time of forming the second magnetic layer 133. For example, the first magnetic layer 131 may be formed of $[Co/Pt]_6$, that is, may be formed by laminating Co and Pt six times, and the second magnetic layer 133 may be formed of $[Co/Pt]_3$, that is, may be formed by laminating Co and Pt three times. In this case, Co may be laminated to a thickness of 0.3 nm to 0.5 nm, and Pt may be laminated thinner than Co, or be laminated to the same thickness as Co. For example, Pt may be laminated to a thickness of 0.2 nm to 0.4 nm.

In addition, in the first magnetic layer 131, a Co layer may be further laminated on the $[Co/Pt]_6$ in which Co/Pt is repeatedly laminated. That is, the first magnetic layer 131 may have a structure in which a Co layer is laminated one more time than a Pt layer. In this case, the Co layer located at the top may be formed thicker than other Co layers below, and may be formed to have a thickness of 0.5 nm to 0.7 nm. In addition, in the second magnetic layer 133, Co and Pt layers may be further laminated on the lower side of the $[Co/Pt]_3$, and a Co layer may be further laminated on the upper side of the $[Co/Pt]_3$. That is, the second magnetic layer 133 may be formed by laminating Co, Pt, $[Co/Pt]_3$, and Co on the non-magnetic layer 132. In this case, the Co layer on the lower side of the $[Co/Pt]_3$ may be formed to have the same thickness as a Co layer included in the $[Co/Pt]_3$ or may be formed thicker than a Co layer included in the $[Co/Pt]_3$. For example, the Co layer on the lower side of the $[Co/Pt]_3$ may be formed to have a thickness of 0.5 nm to 0.7 nm. In addition, the Pt layer on the lower side of the $[Co/Pt]_3$ may be formed to have the same thickness as Pt included in the $[Co/Pt]_3$, and the Co on the upper side of the $[Co/Pt]_3$ may be formed to have the same thickness as Co included in the $[Co/Pt]_3$.

The non-magnetic layer 132 may be formed between the first and second magnetic layers 131 and 133, and may be formed of a nonmagnetic material that allows the first and second magnetic layers 131 and 133 to be diamagnetically connected to each other. For example, the non-magnetic layer 132 may be formed of a single metal selected from the group consisting of ruthenium (Ru), rhodium (Rh), osmium (Os), rhenium (Re), and chromium (Cr) or an alloy thereof, preferably ruthenium (Ru).

The memory device according to an embodiment of the present invention may further include the bridge layer 140 between the synthetic antiferromagnetic layer 130 and the magnetic tunnel junction.

The bridge layer 140 is formed on the upper part of the synthetic antiferromagnetic layer 130. When the bridge layer 140 is formed, the magnetizations of the synthetic antiferromagnetic layer 130 and the pinned layer 150 may be generated independently of each other. In addition, the bridge layer 140 may be formed of a material capable of improving the crystallinity of a magnetic tunnel junction. Accordingly, the bridge layer 140 may be formed of a polycrystalline material, e.g., a conductive material having the BCC structure, preferably tungsten (W). When the bridge layer 140 is formed of a polycrystalline material, the crystallinity of the magnetic tunnel junction formed on the upper part of the bridge layer 140 may be improved.

When the polycrystalline bridge layer 140 is formed, the amorphous magnetic tunnel junction formed on the upper part thereof may grow in the crystal direction of the bridge layer 140, and the crystallinity of the magnetic tunnel junction may be improved by heat treatment for perpendicular magnetic anisotropy as compared with conventional cases.

In particular, when the bridge layer 140 is formed of W, the bridge layer 140 crystallizes after heat treatment at a high temperature of 400° C. or more, for example, 400° C. to 500° C., thereby preventing heterogeneous materials from diffusing into the tunnel barrier layer 160. In addition, the pinned layer 150 and the free layers may crystallize, thereby maintaining the perpendicular magnetic anisotropy of the magnetic tunnel junction. That is, when the crystallinity of the magnetic tunnel junction is improved, the magnitude of magnetization generated when a magnetic field is applied may be increased, and the amount of current flowing through the magnetic tunnel junction in a parallel state may be increased.

Accordingly, when the magnetic tunnel junction according to an embodiment of the present invention is applied to a memory device, the operating speed and reliability of the memory device may be improved. In addition, the bridge layer 140 may be formed to have a thickness of 0.3 nm to 0.5 nm.

The second magnetic layer 133 of the synthetic antiferromagnetic layer 130 and the pinned layer 150 must be ferro-coupled to fix the magnetization direction of the pinned layer 150. However, when W is used to form the bridge layer 140 having a thickness of greater than 0.5 nm, the magnetization direction of the pinned layer 150 is not fixed and has the same magnetization direction as the lower and upper free layers 171 and 172 due to increase in the thickness of the bridge layer 140. As a result, the same magnetization direction and other magnetization directions required in an MRAM device do not occur, and thus the MRAM device does not operate as a memory.

The magnetic tunnel junction is formed on the bridge layer 140. In the magnetic tunnel junction, the pinned layer 150, the tunnel barrier layer 160, the first free layer 171, the spacer layer 180, the coupling layer 190, the buffer layer 200, and the second free layer 172 are laminated in sequential order.

The pinned layer 150 is formed on the bridge layer 140, and is formed of a ferromagnetic material. In the pinned layer 150, magnetization may be fixed to one direction in a magnetic field within a predetermined range. For example, the magnetization direction may be fixed to a direction extending from the upper part to the lower part.

The pinned layer 150 may be formed using a full-Heusler half-metal alloy, an amorphous rare-earth element alloy, a multilayer thin film in which a magnetic metal (ferromagnetic metal) and a non-magnetic metal are alternately laminated, an alloy having an L10 type crystal structure, or a ferromagnetic material such as a cobalt alloy.

As the full-Heusler half-metal alloy, CoFeAl and CoFeAlSi may be used. As the amorphous rare-earth element alloy, alloys such as TbFe, TbCo, TbFeCo, DyTbFeCo, and GdTbCo may be used. In addition, the multilayer thin film in which a magnetic metal and a non-magnetic metal are alternately laminated includes Co/Pt, Co/Pd, CoCr/Pt, Co/Ru, Co/Os, Co/Au, Ni/Cu, CoFeAl/Pd, CoFeAl/Pt, CoFeB/Pd, CoFeB/Pt, and the like.

In addition, the alloy having an L10 type crystal structure includes Fe50Pt50, Fe50Pd50, Co50Pt50, Fe30Ni20Pt50, Co30Ni20Pt50, and the like. In addition, the cobalt alloy includes CoCr, CoPt, CoCrPt, CoCrTa, CoCrPtTa, CoCrNb, CoFeB, and the like. Among these materials, the CoFeB single layer may be formed thicker than CoFeB and Co/Pt or Co/Pd of a multilayer structure, and thus magnetoresistance ratio may be increased.

In addition, since CoFeB is easier to etch than metals such as Pt and Pd, the CoFeB single layer is easier to fabricate than a multilayer structure containing Pt or Pd. In addition, CoFeB may have a perpendicular magnetization or a horizontal magnetization by adjusting the thickness thereof.

Accordingly, according to an embodiment of the present invention, the pinned layer 150 is formed using a CoFeB single layer. In this case, CoFeB is formed in an amorphous form and then textured in the BCC (100) direction by heat treatment.

The tunnel barrier layer 160 separates the pinned layer 150 and the first free layer 171, and allows quantum-mechanical tunneling between the pinned layer 150 and the first free layer 171.

The tunnel barrier layer 160 may be formed of magnesium oxide (MgO), aluminum oxide ($Al_2O_3$), silicon oxide ($SiO_2$), tantalum oxide ($Ta_2O_5$), silicon nitride ($SiN_x$), aluminum nitride ($AlN_x$), or the like. In an embodiment of the present invention, polycrystalline magnesium oxide may be used as the tunnel barrier layer 160. After the tunnel barrier layer 160 is formed of the magnesium oxide, heat treatment is performed for texturing in the BCC (100) direction. In addition, the tunnel barrier layer 160 may be formed to have the same thickness as the pinned layer 150 or may be formed thicker than the pinned layer 150. For example, the tunnel barrier layer 160 may be formed to have a thickness of 0.5 nm to 1.5 nm.

The free layers are formed on the tunnel barrier layer 160. In the free layers, the direction of magnetization is not fixed to one direction, but may be switched from one direction to the opposite direction. That is, the magnetization direction of the free layers may be the same (that is, parallel) as or opposite (that is, antiparallel) to the magnetization direction of the pinned layer 150.

A magnetic tunnel junction may be utilized as a memory element by mapping information to a resistance value which changes depending on the magnetization arrangement of the free layers and the pinned layer 150. For example, the magnetization direction of the free layers may be the same (that is, parallel) as or opposite (that is, antiparallel) to the magnetization direction of the pinned layer 150. The magnetic tunnel junction may be utilized as a memory element by mapping information of '0' or '1' to a resistance value which changes depending on the magnetization arrangement of the free layers and the pinned layer 150.

For example, when the magnetization direction of the free layers is parallel to that of the pinned layer 150, the resistance value of a magnetic tunnel junction becomes small. In this case, data may be defined as '0'. In addition, when the magnetization direction of the free layers is antiparallel to that of the pinned layer 150, the resistance value of a magnetic tunnel junction becomes large. In this case, data may be defined as '1'.

For example, the free layers may be formed of a full-Heusler half-metal alloy, an amorphous rare-earth element alloy, a multilayer thin film in which a magnetic metal and a non-magnetic metal are alternately laminated, or a ferromagnetic material such as an alloy having an L10 type crystal structure.

More specifically, in the free layers, the first free layer 171, the spacer layer 180, the coupling layer 190, the buffer layer 200, and the second free layer 172 are laminated in sequential order. Accordingly, the free layers may be formed in a structure in which the first and second free layers 171 and 172 are separated up and down by the spacer layer 180, the coupling layer 190, and the buffer layer 200. The first and second free layers 171 and 172 may have identical or different magnetization directions.

Accordingly, since the memory device according to an embodiment of the present invention has a double-layer structure including the first and second free layers 171 and 172, thermal stability may be improved compared to a storage layer of a single layer.

In addition, in the memory device according to an embodiment of the present invention, since the first free layer 171 has interface perpendicular magnetic anisotropy (i-PMA), and the second free layer 172 has bulk perpendicular magnetic anisotropy (b-PMA), perpendicular magnetic anisotropy may be enhanced, thereby improving the thermal stability of the free layers and enhancing spin polarization, TMR, and spin-transfer torque.

In the conventional case, since both first and second free layers have i-PMA, there is a limit in improving thermal stability only with i-PMA generated between the free layers and the tunnel barrier layer 160. However, in the case of the memory device according to an embodiment of the present invention, since the second free layer 172 has b-PMA, and the second free layer 172 having b-PMA is formed in a multilayer structure, thermal stability may be greatly improved.

In the memory device according to an embodiment of the present invention, the magnetization directions of i-PMA and b-PMA may be the same through RKKY coupling. In addition, RKKY coupling between i-PMA and b-PMA is highly dependent on the distance between magnetic materials (CoFeB, Co) and the types of metal layers (the spacer layer 180, the coupling layer 190, the buffer layer 200) present between magnetic materials (CoFeB, Co).

The first free layer 171 is formed on the tunnel barrier layer 160. In addition, the first free layer 171 is textured in the BCC (100) direction by heat treatment, and may have a multilayer structure (Fe/CoFeB) in which an Fe layer and a CoFeB layer are laminated. The first free layer 171 may be formed to have the same thickness as the second free layer 172, or may be formed thinner than the second free layer 172.

Since the first free layer 171 further includes an Fe layer in addition to a CoFeB layer, perpendicular magnetization may be further increased. The Fe layer may be formed thinner than the CoFeB layer. For example, the Fe layer may be formed to have a thickness of 0.3 nm to 0.5 nm.

The spacer layer 180 is formed on the first free layer 171. The spacer layer 180 may be formed thinner than the first and second free layers 171 and 172. For example, the spacer layer 180 may be formed to have a thickness of 0.3 nm to 0.8 nm.

When the thickness of the spacer layer 180 is less than 0.3 nm, the spacer layer 180 may not serve as a spacer between the first and second free layers 171 and 172. When the thickness of the spacer layer 180 exceeds 0.8 nm, since the spacer layer 180 becomes too thick, the RKKY coupling force between the first and second free layers 171 and 172 may decrease, and the coupling may disappear.

Accordingly, since the memory device according to an embodiment of the present invention includes the spacer layer 180 between the first and second free layers 171 and 172, Ruderman-Kittel-Kasuya-Yosida (RKKY) coupling between the first and second free layers 171 and 172 may be improved.

The spacer layer 180 may include a material having the BCC structure that does not have magnetization, for example, tungsten (W).

The coupling layer 190 is formed on the spacer layer 180. The spacer layer 180 may be formed thinner than the first and second free layers 171 and 172. For example, the coupling layer 190 may be formed to have a thickness of 0.1 nm to 0.6 nm.

When the thickness of the coupling layer 190 is less than 0.1 nm, the ferromagnetic coupling force between the first and second free layers 171 and 172 decreases, causing deterioration. When the thickness of the coupling layer 190 exceeds 0.6 nm, since the coupling layer 190 becomes too thick, the ferromagnetic coupling force between the first and second free layers 171 and 172 decreases, and thus coupling disappears and coercivity decreases.

Accordingly, since the memory device according to an embodiment of the present invention includes the coupling layer 190 between the first and second free layers 171 and 172, the buffer layer 200 formed on the upper part of the coupling layer 190 may be compensated, and ferromagnetic coupling between the first and second free layers 171 and 172 may be improved.

More specifically, since the distance from the spacer layer 180 to the buffer layer 200 is 1.4 nm to 4.4 nm, and the distance is longer than the cross-sectional width of the second free layer 172 formed on the buffer layer 200, the coupling layer 190 may be connected the first and second free layers 171 and 172 so that the magnetization directions of the first and second free layers 171 and 172 are the same.

In addition, the coupling layer 190 serves as a bridge that assists coupling between the first and second free layers 171 and 172 separated by the thick buffer layer 200.

The coupling layer 190 may include a material having the HCP structure that does not have magnetization, for example, cobalt (Co).

The buffer layer 200 is formed on the coupling layer 190. The buffer layer 200 may be formed thinner than the first and second free layers 171 and 172. For example, the buffer layer 200 may be formed to have a thickness of 1.0 nm to 3.0 nm.

When the thickness of the buffer layer 200 is less than 1.0 nm, the crystallinity of the second free layer 172 may deteriorate, and coercivity may decrease, causing deterioration. When the thickness of the buffer layer 200 exceeds 3.0 nm, RKKY coupling may be weakened, and thus coupling between the first and second free layers 171 and 172 may be disconnected so that the first and second free layers 171 and 172 do not oriented in the same direction.

The buffer layer 200 may be formed of a metal that facilitates crystal growth of the second free layer 172 in the (111) direction of a face-centered cubic (FCC) lattice.

Accordingly, since the memory device according to an embodiment of the present invention includes the buffer layer 200 including a material having the FCC structure between the first and second free layers 171 and 172, the buffer layer 200 may serve as a seed layer for growing the second free layer 172 in the FCC direction, and may improve the crystallinity of the second free layer 172.

The buffer layer 200 may include at least one of platinum (Pt), titanium (Ti), palladium (Pd), magnesium (Mg), cobalt (Co), aluminum (Al), and tungsten (W), preferably platinum (Pt).

The second free layer 172 is formed on the buffer layer 200. The second free layer 172 may be textured in the FCC (111) direction by heat treatment, and may have a multilayer structure in which a Co layer and a Pt layer are alternately laminated two or more times (hereinafter designated as [Co/Pt]$_n$). That is, the second free layer 172 may be represented as [Co/Pt]$_n$ (n is 2 or more).

Accordingly, in the memory device according to an embodiment of the present invention, since the second free layer 172 has a multilayer structure in which a Co layer and a Pt layer are alternately laminated two or more times, anisotropy energy may be increased, thereby improving thermal stability.

In addition, the first free layer 171 is textured in the BCC direction, and the second free layer 172 is textured in the FCC direction. When the first free layer 171 is not textured in in the BCC direction, and the second free layer 172 is not textured in the FCC direction, magnetic moment or squareness may be reduced due to deterioration in vibrating sample magnetometry (VSM).

For example, the number of layers of the second free layer 172 having a multilayer structure of [Co/Pt]$_n$ may be 3 to 9. When the number of layers of the multilayer structure of [Co/Pt]$_n$ is less than 3, anisotropy energy may decrease. When the number of layers of the multilayer structure of [Co/Pt]$_n$ exceeds 9, tunnel magnetoresistance (TMR) ratio may decrease.

The Co layer included in the second free layer 172 may have a thickness of 0.2 nm to 0.6 nm. When the thickness of the Co layer of the second free layer 172 is less than 0.2 nm, magnetic properties may be degraded. When the thickness of the Co layer of the second free layer 172 exceeds 0.6 nm, perpendicular magnetic anisotropy (PMA) may be degraded.

The Pt layer included in the second free layer 172 may be thinner than the Co layer, or may have the same thickness as the Co layer. For example, the Pt layer may have a thickness of 0.2 nm to 0.6 nm. When the thickness of the Pt layer of the second free layer 172 is less than 0.2 nm, magnetic properties may be degraded. When the thickness of the Pt layer of the second free layer 172 exceeds 0.6 nm, RKKY coupling strength may be reduced.

The thicknesses of the Pt layer and the Co layer of the second free layer 172 are important factors to adjust an optimum thickness condition under an RKKY coupling condition. When the thickness of the second free layer 172 is outside the aforementioned range, the squareness of the M-H curve of vibrating sample magnetometry (VSM) may be degraded.

In addition, a Co layer may be further formed on the uppermost layer of the second free layer 172 having the multilayer structure of [Co/Pt]$_n$. That is, in the second free layer 172, a Co layer may be formed once more than a Pt layer, and the uppermost Co layer may be formed thicker than the lower Co layer. For example, the uppermost Co layer may be formed to have a thickness of 0.5 nm to 0.7 nm.

According to an embodiment, the memory device according to an embodiment of the present invention may further include the capping layer 210 between the magnetic tunnel junction and the upper electrode 220.

The capping layer 210 is formed on the magnetic tunnel junction. The capping layer 210 may have a laminated structure in which an iron (Fe) layer and a tungsten (W) layer are laminated. In addition, since the capping layer 210 is formed of a polycrystalline material, the crystallinity of the magnetic tunnel junction may be improved.

Accordingly, when the capping layer 210 is formed on the magnetic tunnel junction, and then heat treatment is performed, the crystallinity of the magnetic tunnel junction may be further improved. In addition, the capping layer 210 serves to prevent diffusion of the upper electrode 220. For example, the capping layer 210 may be formed to have a thickness of 0.3 nm to 0.5 nm.

The upper electrode 220 is formed on the capping layer 210. The upper electrode 220 may be formed using a conductive material such as a metal, a metal oxide, or a metal nitride. For example, the upper electrode 220 may be formed of at least one of tantalum (Ta), ruthenium (Ru), titanium (Ti), palladium (Pd), platinum (Pt), magnesium (Mg), and aluminum (Al).

As described above, since the memory device according to an embodiment of the present invention includes the spacer layer 180, the coupling layer 190, and the buffer layer 200 between the first and second free layers 171 and 172, thermal stability may be improved.

The memory device according to an embodiment of the present invention may be a perpendicular-spin transfer torque magnetoresistive RAM (p-STT MRAM). According to the memory device according to an embodiment of the present invention, in 1 transistor and 1 capacitor (1T1C), which is a basic cell unit of a conventional dynamic random access memory (DRAM), a perpendicular-magnetic tunnel junction (p-MTJ) is used instead of a capacitor. Thus, the memory device of the present invention has the non-volatile characteristics of the p-MTJ while maintaining the characteristics of the high-speed DRAM. Accordingly, the memory device of the present invention is a non-volatile memory capable of high-speed rewriting and may replace all existing memories (DRAM, SRAM, flash memory).

Hereinafter, the properties of the memory device according to an embodiment of the present invention will be described.

FIGS. 3A to 3E and FIGS. 4A to 4E are graphs showing the magnetic properties of the memory device according to an embodiment of the present invention depending on the thickness of the coupling layer of the memory device.

FIGS. 3A and 4A are graphs showing the magnetic properties of the memory device including a coupling layer (Co) having a thickness of 0 nm, FIGS. 3B and 4B are graphs showing the magnetic properties of the memory device including a coupling layer (Co) having a thickness of 0.18 nm, FIGS. 3C and 4C are graphs showing the magnetic properties of the memory device including a coupling layer (Co) having a thickness of 0.29 nm, FIGS. 3D and 4D are graphs showing the magnetic properties of the memory device including a coupling layer (Co) having a thickness of 0.38 nm, and FIGS. 3E and 4E are graphs showing the magnetic properties of the memory device including a coupling layer (Co) having a thickness of 0.48 nm.

Referring to FIGS. 3A to 3E and FIGS. 4A to 4E, in the memory device according to an embodiment of the present invention, as the thickness of the coupling layer decreases, coupling between CoFeB of the first free layer and $[Co/Pt]_n$, which is the second free layer, is weakened, thereby degrading the squareness of the free layers.

Accordingly, in the memory device according to an embodiment of the present invention, as the thickness of the coupling layer increases, the perpendicular magnetic properties of the free layers (information storage layer) are improved in a narrow magnetic field range (−500 Oe to 500 Oe) and a wide magnetic field range (>1 kOe or <−1 kOe).

FIGS. 5A to 5E and FIGS. 6A to 6E are graphs showing the magnetic properties of the memory device according to an embodiment of the present invention depending on the thickness of the buffer layer of the memory device.

FIGS. 5A and 6A are graphs showing the magnetic properties of the memory device including a buffer layer (Pt) having a thickness of 1.02 nm, FIGS. 5B and 6B are graphs showing the magnetic properties of the memory device including a buffer layer (Pt) having a thickness of 1.24 nm, FIGS. 5C and 6C are graphs showing the magnetic properties of the memory device including a buffer layer (Pt) having a thickness of 1.4 nm, FIGS. 5D and 6D are graphs showing the magnetic properties of the memory device including a buffer layer (Pt) having a thickness of 1.61 nm, and FIGS. 5E and 6E are graphs showing the magnetic properties of the memory device including a buffer layer (Pt) having a thickness of 1.80 nm.

Referring to FIGS. 5A to 5E and FIGS. 6A to 6E, in the memory device according to an embodiment of the present invention, as the thickness of the buffer layer decreases, the crystallinity of $[Co/Pt]_n$, which is the second free layer, is weakened. When the thickness of the buffer layer is less than 1.0 nm, deterioration occurs rapidly.

Accordingly, in the memory device according to an embodiment of the present invention, as the thickness of the buffer layer increases, the perpendicular magnetic properties of the free layers (information storage layer) are improved in a narrow magnetic field range (−500 Oe to 500 Oe) and a wide magnetic field range (>1 kOe or <−1 kOe).

FIG. 7 shows a graph showing coercivity depending on the thickness of the buffer layer of the memory device according to an embodiment of the present invention.

Referring to FIG. 7, in the memory device according to an embodiment of the present invention, as the thickness of the buffer layer (Pt) decreases, the crystallinity of $[Co/Pt]_n$, which is the second free layer, is degraded, thereby reducing a coercivity value and causing deterioration.

Accordingly, in the memory device according to an embodiment of the present invention, by increasing the thickness of the buffer layer, a coercivity value may be increased.

FIGS. 8A to 8D and FIGS. 9A to 9D are graphs showing the magnetic properties of the memory device according to an embodiment of the present invention depending on the thickness of the spacer layer of the memory device.

FIGS. 8A and 9A are graphs showing the magnetic properties of the memory device including a spacer layer (W) having a thickness of 0.33 nm, FIGS. 8B and 9B are graphs showing the magnetic properties of the memory device including a spacer layer (W) having a thickness of 0.60 nm, FIGS. 8C and 9C are graphs showing the magnetic properties of the memory device including a spacer layer (W) having a thickness of 0.73 nm, and FIGS. 8D and 9D are graphs showing the magnetic properties of the memory device including a spacer layer (W) having a thickness of 0.87 nm.

Referring to FIGS. 8A to 8D and FIGS. 9A to 9D, in the memory device according to an embodiment of the present invention, as the thickness of the spacer layer increases, RKKY coupling (W: 0.87 nm) force between CoFeB of the first free layer and $[Co/Pt]_n$, which is the second free layer, decreases. On the other hand, as the thickness of the spacer layer decreases, the spacer layer does not act as a spacer between CoFeB of the first free layer and [Co/Pt]$_n$, which is the second free layer, so the free layers are liable to be damaged.

FIG. 10 illustrates the structure of the free layers of the memory device according to an embodiment of the present invention.

In the memory device according to an embodiment of the present invention, the free layers are designed to include Fe/CoFeB (first free layer), W (spacer layer), Co (coupling layer), Pt (buffer layer), and [Co/Pt]. (second free layer).

FIG. 11A is a graph showing the anisotropy energy of a conventional memory device and the memory device according to an embodiment of the present invention, and FIG. 11B is a graph showing thermal stability depending on the number of lamination of the second free layer of the memory device according to an embodiment of the present invention.

In the case of the conventional memory device, free layers include only Fe/CFB (first free layer), W (spacer layer), and CoFeB (second free layer). The memory device according to an embodiment of the present invention has a structure shown in FIG. 10.

Referring to FIGS. 11A and 11B, as the number of lamination of the second free layer ([Co/Pt]$_n$) increases, the anisotropy energy of the free layers of the memory device according to an embodiment of the present invention heat-treated at 350° C. increases.

More specifically, the conventional memory device has an anisotropy energy of 0.625 erg/cm$^2$. When the number of lamination of the second free layer ([Co/Pt]$_n$) is 2, the memory device according to an embodiment of the present invention has an anisotropy energy of 0.621 erg/cm$^2$, which is similar to that of the conventional memory device. When the number of lamination of the second free layer ([Co/Pt]$_n$) is 3, the memory device according to an embodiment of the present invention has an anisotropy energy of 1.0998 erg/cm$^2$, which is more than twice that of the conventional memory device. When the number of lamination of the second free layer ([Co/Pt]$_n$) is 9, the memory device according to an embodiment of the present invention has an anisotropy energy of 0.3233 erg/cm$^2$, which is more than five times that of the conventional memory device.

In addition, as a result of calculating thermal stability using anisotropy energy shown in FIG. 11A, when the number of lamination of the second free layer ([Co/Pt]$_n$) of the memory device according to an embodiment of the present invention is 9, based on a 10 nm-wide memory cell, thermal stability is 77 or more, and retention time is 10 years.

Accordingly, in the memory device according to an embodiment of the present invention, as the number of lamination of the second free layer ([Co/Pt]$_n$) increases, anisotropy energy increases, and thermal stability is improved.

FIGS. 12A to 12C are graphs showing magnetization curves depending on the number of lamination of the second free layer of the memory device according to an embodiment of the present invention.

FIG. 12A is a graph showing the magnetization curves of a memory device characterized in that the number of lamination of a second free layer ([Co/Pt]$_n$) is 2, FIG. 12B is a graph showing the magnetization curves of a memory device characterized in that the number of lamination of a second free layer ([Co/Pt]$_n$) is 3, and FIG. 12C is a graph showing the magnetization curves of a memory device characterized in that the number of lamination of a second free layer ([Co/Pt]$_n$) is 4.

Referring to FIGS. 12A to 12C, the perpendicular magnetic tunnel junction of the memory device according to an embodiment of the present invention is designed so that the number of lamination of the second free layer ([Co/Pt]$_n$) is 2, 3, or 4, and heat treatment is performed at 350° C.

In the memory device according to an embodiment of the present invention, at the magnetization curve of a wide magnetic field range (−4 kOe to 4 kOe), the synthetic antiferromagnetic layer and the pinned layer exhibit perpendicular magnetic anisotropy. At the magnetization curve of a narrow magnetic field range (−500 Oe to 500 Oe), the free layers exhibit perpendicular magnetic anisotropy.

More specifically, at the magnetization curve of a wide magnetic field range (−4 kOe to 4 kOe), when the number of lamination of the second free layer ([Co/Pt]$_n$) is 2, 3, and 4, exchange magnetic field (Hex) values are 2.233 kOe, 2.213 kOe, and 2.133 kOe, respectively. These results indicate that the magnetization directions of the synthetic antiferromagnetic layer and the pinned layer are well fixed.

On the other hand, at the magnetization curve of a narrow magnetic field range (−500 Oe to 500 Oe), as the number of lamination of the second free layer ([Co/Pt]$_n$) increases, a magnetic moment value increase constantly, and thermal stability is improved.

FIG. 13 is a graph showing the tunnel magnetoresistance (TMR) of the memory device according to an embodiment of the present invention.

Referring to FIG. 13, tunnel magnetoresistance changes according to the thickness of CoFeB ($Co_2Fe_6B_2$) included in the first free layer of the memory device according to an embodiment of the present invention. When the number of lamination of the second free layer ([Co/Pt]$_n$) is 2, tunnel magnetoresistance is 137%. When the number of lamination of the second free layer ([Co/Pt]$_n$) is 3, tunnel magnetoresistance is 127%. When the number of lamination of the second free layer ([Co/Pt]$_n$) is 4, tunnel magnetoresistance is 98%. That is, as the number of lamination of the second free layer ([Co/Pt]$_n$) increases, tunnel magnetoresistance gradually decreases.

FIG. 14 is a schematic block diagram showing an example of a memory system including the memory device according to an embodiment of the present invention.

Referring to FIG. 14, a memory system 1100 may be applied to PDAs, portable computers, web tablets, wireless phones, mobile phones, digital music players, memory cards, and devices for transmitting and/or receiving information in a wireless environment.

The memory system 1100 includes a controller 1110, an input/output device 1120 such as a keypad, a keyboard, and a display, a memory 1130, an interface 1140, and a bus 1150. The memory 1130 and the interface 1140 are communicated with each other through the bus 1150.

The controller 1110 includes at least one microprocessor, a digital signal processor, a microcontroller, or other processing devices. The memory 1130 may be used to store commands executed by the controller. The input/output device 1120 may receive data or signals from outside of the memory system 1100 or may output data or signals to the outside of the system 1100. For example, the input/output device 1120 may include a keyboard, a keypad, or a display device.

The memory 1130 includes the memory device according to an embodiment of the present invention. In addition, the memory 1130 may further include other types of memories, volatile memories that can be accessed at any time, and other various types of memories.

The interface 1140 serves to transmit data to a communication network or receive data from the network.

FIG. 15 is a schematic block diagram showing an example of a memory card including a memory device according to an embodiment of the present invention.

Referring to FIG. 15, a memory device 1210 according to an embodiment of the present invention is mounted on a memory card 1200 for supporting a high-capacity data storage capability. The memory card 1200 according to the present invention includes a memory controller 1220 that controls exchange of various data between a host and the memory device 1210 according to an embodiment of the present invention.

SRAM 1221 is used as an operating memory for a central processing device 1222. The host interface 1223 includes a data exchange protocol of a host connected to the memory card 1200. An error correction block 1224 detects and corrects errors included in data read from the memory device 1210 according to an embodiment of the present invention. The memory interface 1225 interfaces with the memory device 1210 according to an embodiment of the present invention. The central processing unit 1222 performs various control operations for data exchange of the memory controller 1220. Although not shown in the drawings, it is common knowledge in this field that the memory card 1200 according to an embodiment of the present invention may further include a ROM (not shown) for storing code data for interfacing with a host.

FIG. 16 is a schematic block diagram showing an example of an information processing system including the memory device according to an embodiment of the present invention.

Referring to FIG. 16, a memory system 1310 according to an embodiment of the present invention is mounted on an information processing system such as a mobile device or a desktop computer. An information processing system 1300 according to the present invention includes the memory system 1310 according to an embodiment of the present invention, a modem 1320, a central processing unit 1330, a RAM 1340, and a user interface 1350 electrically connected to a system bus 1360. The memory system 1310 according to an embodiment of the present invention may include a memory controller 1312 and a memory device 1311 according to an embodiment of the present invention. Data processed by the central processing unit 1330 or data input from the outside is stored in the memory system 1310 according to an embodiment of the present invention.

Here, the memory system 1310 according to an embodiment of the present invention described above may be configured as a semiconductor disk device (SSD). In this case, the information processing system 1300 may stably store a large amount of data in the memory system 1310 according to an embodiment of the present invention. In addition, as reliability increases, the memory system 1310 according to an embodiment of the present invention may reduce resources required for error correction, and thus may provide a high-speed data exchange function to the information processing system 1300. Although not shown, it is apparent to those skilled in the art that the information processing system 1300 according to the present invention may further include an application chipset, a camera image processor (CIS), an input/output device, and the like.

In addition, the memory device or the memory system according to an embodiment of the present invention may be packaged in various ways, and then may be mounted. For example, the memory device or the memory system according to an embodiment may be packaged in various ways such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi-chip package (MCP), wafer-level fabricated package (WFP), and wafer-level processed stack package (WSP), and then may mounted.

Meanwhile, embodiments of the present invention disclosed in the present specification and drawings are only provided to aid in understanding of the present invention and the present invention is not limited to the embodiments. It will be apparent to those skilled in the art that various modifications can be made to the above-described exemplary embodiments of the present invention without departing from the spirit and scope of the invention.

[Description of Symbols]

| | |
|---|---|
| 100: SUBSTRATE | 105: INSULATING LAYER |
| 110: LOWER ELECTRODE | 111: FIRST LOWER ELECTRODE |
| 112: SECOND LOWER ELECTRODE | 120: SEED LAYER |
| 130: SYNTHETIC ANTIFERROMAGNETIC LAYER | |
| 131: FIRST MAGNETIC LAYER | |
| 132: NON-MAGNETIC LAYER | 133: SECOND MAGNETIC LAYER |
| 140: BRIDGE LAYER | 150: PINNED LAYER |
| 160: TUNNEL BARRIER LAYER | 171: FIRST FREE LAYER |
| 172: SECOND FREE LAYER | 180: SPACER LAYER |
| 190: COUPLING LAYER | 200: BUFFER LAYER |
| 210: CAPPING LAYER | 220: UPPER ELECTRODE |
| 230: SUPPLEMENTARY LAYER | |

What is claimed is:

1. A memory device, comprising a lower electrode, a seed layer, a synthetic antiferromagnetic (SyAF) layer, a magnetic tunnel junction, and an upper electrode laminated on a substrate,
    wherein the magnetic tunnel junction comprises a pinned layer, a tunnel barrier layer, and free layers,
    wherein the free layers comprise a first free layer, a spacer layer, a coupling layer, a buffer layer, and a second free layer laminated in sequential order, and
    wherein the first free layer has a multilayer structure in which an Fe layer and a CoFeB layer are laminated.

2. The memory device according to claim 1, wherein the coupling layer comprises a material having an HCP structure.

3. The memory device according to claim 2, wherein the material having an HCP structure comprises cobalt (Co).

4. The memory device according to claim 1, wherein the buffer layer comprises a material that allows the second free layer to grow in an FCC direction.

5. The memory device according to claim 1, wherein the buffer layer comprises at least one of platinum (Pt), titanium (Ti), palladium (Pd), magnesium (Mg), cobalt (Co), aluminum (Al), and tungsten (W).

6. A memory device, comprising a lower electrode, a seed layer, a synthetic antiferromagnetic (SyAF) layer, a magnetic tunnel junction, and an upper electrode laminated on a substrate,
wherein the magnetic tunnel junction comprises a pinned layer, a tunnel barrier layer, and free layers,
wherein the free layers comprise a first free layer, a spacer layer, a coupling layer, a buffer layer, and a second free layer laminated in sequential order, and
wherein the second free layer has a multilayer structure in which a Co layer and a Pt layer are alternately laminated two or more times.

7. The memory device according to claim 6, wherein, in the second free layer having the multilayer structure in which the Co layer and the Pt layer are laminated two or more times, the number of layers of the multilayer structure is 3 to 9.

8. The memory device according to claim 6, wherein the Co layer of the second free layer has a thickness of 0.2 nm to 0.6 nm.

9. The memory device according to claim 6, wherein the Pt layer of the second free layer has a thickness of 0.2 nm to 0.6 nm.

10. The memory device according to claim 1, wherein the coupling layer has a thickness of 0.1 nm to 0.6 nm.

11. The memory device according to claim 1, wherein the buffer layer has a thickness of 1.0 nm to 3.0 nm.

12. The memory device according to claim 1, wherein the spacer layer has a thickness of 0.3 nm to 0.8 nm.

13. The memory device according to claim 1, wherein the lower electrode has a laminated structure in which a first lower electrode comprising tungsten (W) and a second lower electrode comprising titanium nitride (TiN) are laminated.

14. The memory device according to claim 1, further comprising a bridge layer between the synthetic antiferromagnetic layer and the magnetic tunnel junction.

15. The memory device according to claim 1, further comprising a capping layer between the magnetic tunnel junction and the upper electrode.

* * * * *